(12) United States Patent
Yamasaki

(10) Patent No.: US 7,352,005 B2
(45) Date of Patent: Apr. 1, 2008

(54) ELECTRO-OPTICAL DEVICE, MANUFACTURING METHOD THEREOF, AND ELECTRONIC APPARATUS

(75) Inventor: Yasuji Yamasaki, Chitose (JP)

(73) Assignee: Seiko Epson Corporation, Tokyo (JP)

( * ) Notice: Subject to any disclaimer, the term of this patent is extended or adjusted under 35 U.S.C. 154(b) by 53 days.

(21) Appl. No.: 11/384,968

(22) Filed: Mar. 20, 2006

(65) Prior Publication Data

US 2006/0226423 A1  Oct. 12, 2006

(30) Foreign Application Priority Data

Apr. 11, 2005  (JP)  ............................. 2005-113147
Feb. 3, 2006  (JP)  ............................. 2006-026590

(51) Int. Cl.
*H01L 29/04* (2006.01)
*H01L 21/82* (2006.01)

(52) U.S. Cl. ........................... 257/59; 257/79; 257/351; 257/E27.1; 438/128

(58) Field of Classification Search .................. 257/59, 257/222, 291, 227, 223, E27.1, E27.125, 257/E27.112, 79, 350, 351, 352; 438/128, 438/149

See application file for complete search history.

(56) References Cited

U.S. PATENT DOCUMENTS

2004/0109128 A1* 6/2004 Hirabayashi ................. 349/187

FOREIGN PATENT DOCUMENTS

| JP | 06-003703 A | 1/1994 |
| JP | 07-049508 A | 2/1995 |
| JP | 2002-156652 A | 5/2002 |

* cited by examiner

*Primary Examiner*—Howard Weiss
*Assistant Examiner*—(Vikki) Hoa B Trinh
(74) *Attorney, Agent, or Firm*—AdvantEdge Law Group, LLC

(57) ABSTRACT

The disclosure is directed to an electro-optical device and manufacturing method. In one example, a storage capacitor is disposed above a data line. The storage capacitor has a stacked structure of a fixed-potential electrode, a dielectric layer, and a pixel-potential electrode. The storage capacitor is disposed in an area including a region opposed to a channel region of a pixel-switching thin film transistor. A peripheral circuit is disposed in a peripheral area located around a pixel array area. The peripheral circuit includes a peripheral-circuit thin film transistor. The dielectric layer includes a peripheral dielectric layer area having a region opposed to the channel region of the peripheral-circuit thin film transistor.

12 Claims, 15 Drawing Sheets

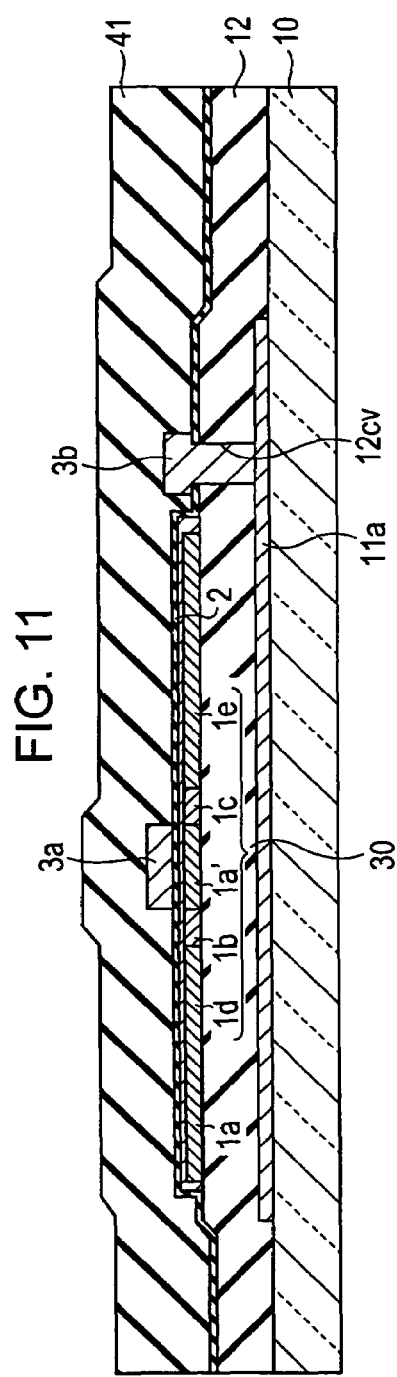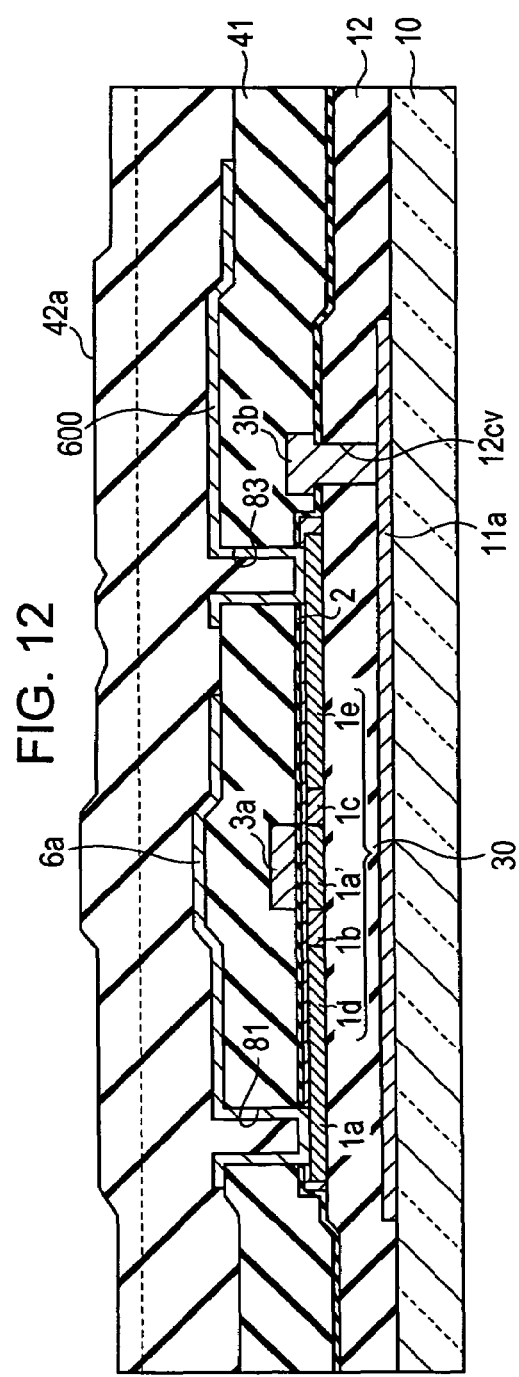

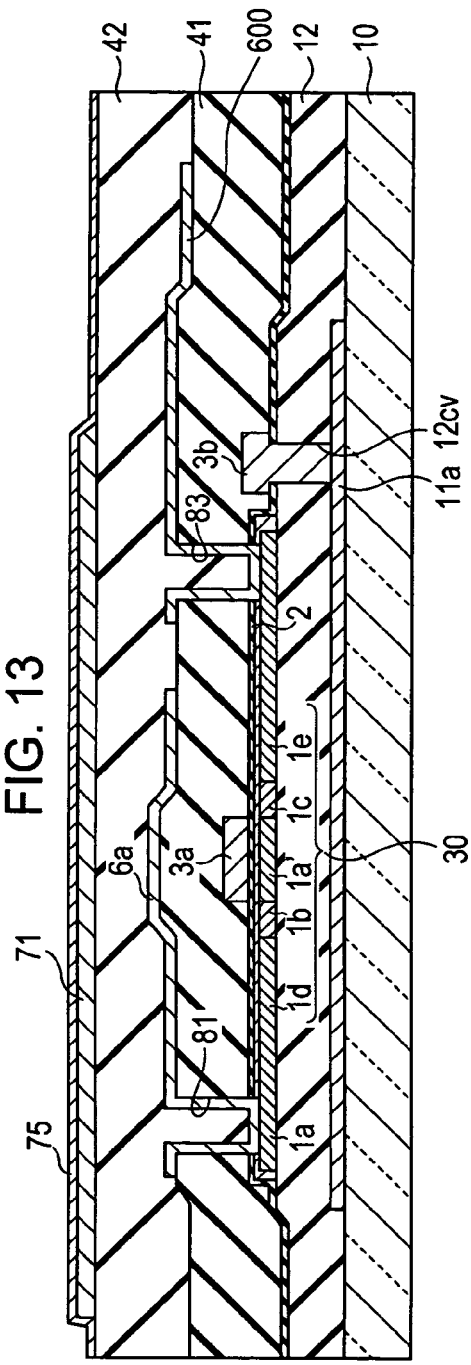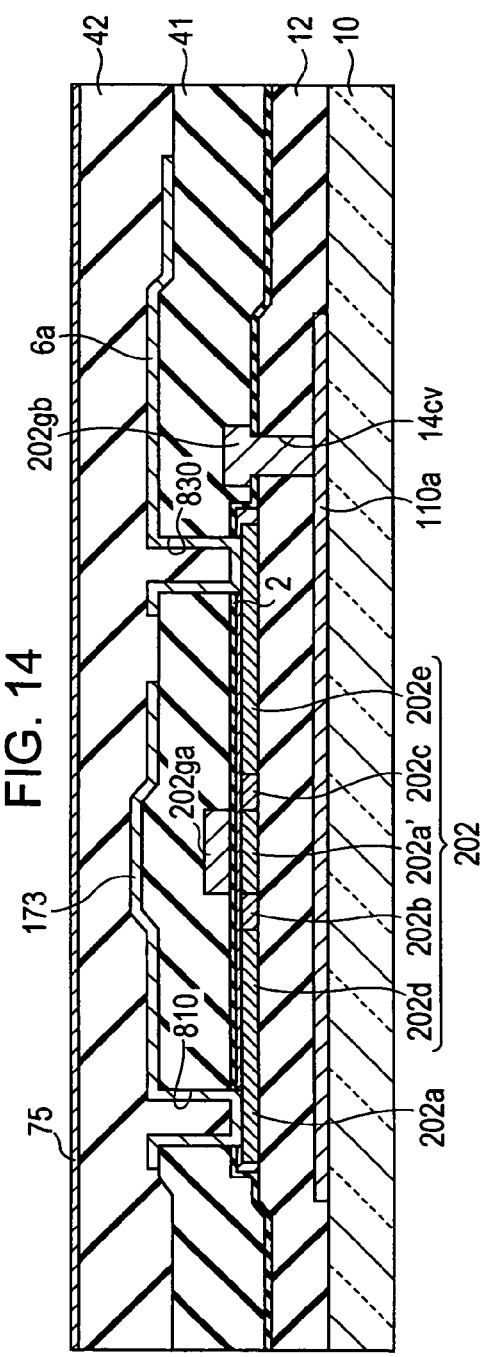

ELECTRO-OPTICAL DEVICE, MANUFACTURING METHOD THEREOF, AND ELECTRONIC APPARATUS

BACKGROUND

1. Technical Field

This disclosure relates to an electro-optical device such as a liquid crystal device, a manufacturing method thereof, and an electronic apparatus such as a liquid crystal projector.

2. Related Art

Such a kind of electro-optical device includes pixel electrodes, peripheral circuits, scanning lines, data lines, and thin film transistors (TFT) as pixel-switching elements on a substrate and is driven in an active matrix manner. Storage capacitors may be disposed between the TFTs and the pixel electrodes so as to enhance a contrast ratio. These elements are integrated with a high density on the substrate so as to accomplish enhancement in aperture ratio of the pixels and reduction in size of the devices (for example, see JP-A-2002-156652).

The enhancement in display quality, the reduction in size, and the increase in precision have been required and thus various countermeasures have been studied in addition to those described above. For example, when light is incident on a semiconductor layer of a TFT, light leakage current is generated, thereby deteriorating the display quality. Accordingly, a light blocking layer is disposed around the semiconductor layer. It is preferable that the storage capacitor has a capacity as large as possible, but the storage capacitor has to be designed not to damage the aperture ratio of the pixels. It is preferable that these circuit elements are integrated with a high density so as to reduce the size of a device.

On the other hand, the shapes and the manufacturing methods of electronic elements such as storage capacitors in the electro-optical devices have been studied. As a result, there have been a variety of technologies for enhancing performance and manufacturing yield (for example, see JP-A-6-3703 and JP-A-7-49508).

However, in the related technologies described above, the stacked structure on the substrate has been basically complicated with enhancement in function and or performance, thereby causing increase in complexity of the manufacturing method thereof and deterioration in manufacturing yield. On the contrary, if it is intended to simplify the stacked structure on the substrate and the manufacturing process, deterioration in light blocking ability or deterioration of the TFTs constituting the pixels and the peripheral circuits due to moisture are caused, so it is easy to cause deterioration in display quality due to deterioration of image signals.

SUMMARY

An advantage of certain embodiments is to provide an electro-optical device which can accomplish simplification of a stacked structure and a manufacturing process and which can display an image with high quality, a method of manufacturing the electro-optical device, and an electronic apparatus having the electro-optical device.

According to an aspect of certain embodiments, there is provided an electro-optical device comprising: data lines and scanning lines extending to intersect each other on a substrate; a pixel-switching thin film transistor disposed in pixels defined to correspond to between the data lines and the scanning lines, the pixel-switching thin film transistor being disposed below the data lines on the substrate; a storage capacitor having a stacked structure of a high-potential electrode, a dielectric layer, and pixel-potential electrode, the storage capacitor being disposed in an area including a region opposed to a channel region of the pixel-switching thin film transistor as seen from the upside of the substrate and being disposed above the data lines; a pixel electrode electrically connected to the pixel-potential electrode and the pixel-switching thin film transistor, the pixel electrode being disposed above the storage capacitor for each pixel; and a peripheral circuit for driving the pixel electrode through the data lines and the scanning lines, the peripheral circuit being disposed in a peripheral area located around a pixel array area in which the pixels are arranged. Here, the dielectric layer includes a non-opened area located between opened areas of the pixels and a peripheral dielectric layer area including a region opposed to a channel region of a peripheral-circuit thin film transistor disposed below the storage capacitor and constituting the peripheral circuit, as seen from the upside of the substrate.

In the electro-optical device according to certain embodiments, an image signal is supplied to a sampling circuit as an example of the peripheral circuit including a sampling switch as an example of the peripheral-circuit thin film transistor (hereinafter, properly referred to as "peripheral-circuit TFT") through a data-line driving circuit as an example of the peripheral circuit at the time of operation. The image signal supplied to the sampling circuit is supplied to each pixel through the data lines at the time of supplying the image signal through a sampling switch. At the same time, a scanning signal is supplied to each pixel through the scanning lines from a scanning-line driving circuit as an example of the peripheral circuit. The pixel-switching thin film transistor (hereinafter, properly referred to as "pixel-switching TFT") provided for each pixel, the gate of which is connected to the corresponding scanning line, selectively supplies the image signal to the pixel electrode in response to the scanning signal. Accordingly, by driving an electro-optical material such as liquid crystal interposed between the pixel electrode and the counter electrode in a unit of pixel, an active matrix driving can be performed. At this time, the potential holding characteristic of the pixel electrode is improved by the storage capacitor, thereby displaying an image with high contrast. In the storage capacitor, the high-potential electrode, the dielectric layer, and the pixel-potential electrode may be stacked in that order or in the reversed order.

In certain embodiments, the dielectric layer is formed in the non-opened area. That is, the dielectric layer is formed in all or a part of the non-opened area. In other words, the dielectric layer may little or never be formed in the opened area. Accordingly, even when the dielectric layer is an opaque layer, the transmissivity of the opened area is not deteriorated. Therefore, since it is not necessary to consider the transmissivity of the dielectric layer of the capacitor, it is possible to use a silicon nitride layer having a high dielectric constant.

Accordingly, the dielectric layer can serve as a layer for preventing water or moisture, that is, a passivation layer. That is, since the storage capacitor is disposed in the area including the region opposed to the channel region of the pixel-switching TFT as seen from the upside of the substrate, it is possible to enhance the water-resistance and moisture-resistance of the pixel-switching TFT.

On the other hand, the dielectric layer is also formed in the peripheral dielectric layer area including the region opposed to the channel region of the peripheral-circuit TFT constituting the peripheral circuit such as the data-line driving circuit, the scanning-line driving circuit, and the sampling circuit. That is, preferably, the dielectric layer is formed in all or a part of the peripheral area. Since the dielectric layer can serve as a passivation layer as described above, it is possible to prevent the deterioration of the channel region of the peripheral-circuit TFT due to water or moisture and thus to enhance the water-resistance and moisture-resistance of the peripheral-circuit TFT. In order to enhance the performance as the passivation layer, it is preferable that the dielectric layer is formed in an area as wide as possible in the peripheral area or all the peripheral area.

Specifically, when the TFT is of a p-channel type, the channel region of the TFT can be easily deteriorated. Accordingly, it is possible to more effectively prevent the deterioration of the channel region of the TFT due to water or moisture by the use of the dielectric layer.

As described above, since the dielectric layer serves as a capacitor layer of the storage capacitor and a passivation layer, it is not necessary to form a new layer as the passivation layer. Accordingly, it is possible to enhance water-resistance and moisture-resistance of the peripheral circuits.

As a result, it is possible to simplify the stacked structure on the substrate and to enhance the water-resistance and the moisture-resistance of the pixel-switching TFT and the peripheral-switch TFT by the use of the dielectric layer, thereby making it possible to display an image with high quality. In addition, the reliability of the electro-optical device is improved. Furthermore, the simplification of the stacked structure on the substrate causes simplification of the manufacturing process and enhancement in yield.

The dielectric layer may have a slit in the peripheral dielectric layer area.

According to the embodiment, since the dielectric layer slits, that is, breaks or openings, in the peripheral area, it is possible to reduce the stress resulting from the fact that the dielectric layer is interposed between the upper and lower layers. For example, the stress can be remarkably generated through a heating process in the process of manufacturing an electro-optical device, but the stress can be efficiently reduced thanks to the slits. In addition, it is also possible to reduce the stress generated after completing a product or at the time of operation of the product. Accordingly, it is possible to prevent damages such as cracks due to the stress in the dielectric layer. As a result, it is possible to enhance the reliability of the electro-optical device.

The slits may be formed a part between edges of the peripheral dielectric layer area and a peripheral circuit area in which the peripheral circuit is disposed, in the peripheral area, and between the pixel array area and the peripheral circuit area as seen from the upside of the substrate.

In this case, it is possible to enhance water-resistance and moisture-resistance of the peripheral circuits and to more efficiently prevent damages such as cracks due to the stress in the dielectric layer.

The slits may extend to edges of the peripheral dielectric layer area to be cut in from the edges.

In this case, the slits are formed to be cut from the edges of the peripheral dielectric layer area, that is, to be opened or released toward the edges of the peripheral dielectric layer area from the insides of the slits as seen from the upside of the substrate. Accordingly, it is possible to enhance water-resistance and moisture-resistance of the peripheral circuits and to more efficiently prevent damages such as cracks due to the stress in the dielectric layer.

Since the electronic apparatus according to certain embodiments comprises the electro-optical device described above, a variety of electronic apparatuses capable of displaying an image with high quality can be embodied, such as a television, a mobile phone, an electronic pocketbook, a word processor, a view finder type or monitor direct vision-type video tape recorder, a work station, a television phone, a POS terminal, an apparatus having a touch panel, and an image forming apparatus such as a printer, a copier, and a facsimiles using the electro-optical device as an exposure head. Examples of the electronic apparatus can also include an electrophoresis device such as an electronic paper and an electron emission device (such as a field emission display and a conduction electron-emitter display).

According to another aspect, there is provided a method of manufacturing an electro-optical device having, on a substrate, data lines and scanning lines extending to interest each other, a top-gate pixel-switching thin film transistor disposed below the data lines, a storage capacitor disposed above the data lines, a pixel electrode disposed above the storage capacitor, and a peripheral circuit for driving the pixel electrode. The method comprises: forming the pixel-switching thin film transistor for each pixel, wherein the pixels are defined by the data lines and the scanning lines as seen from the upside of the substrate; forming the data lines above the pixel-switching thin film transistor; forming the storage capacitor in an area including a region opposed to a channel region of the pixel-switching thin film transistor as seen from the upside of the substrate so that the storage capacitor has a stacked structure of a fixed-potential electrode, a dielectric layer, and a pixel-potential electrode above the data lines, and forming the dielectric layer in a non-opened area between opened areas of the pixels and a peripheral dielectric layer area including a region opposed to a channel region of a peripheral-circuit thin film transistor disposed below the storage capacitor and constituting the peripheral circuit as seen from the upside of the substrate; and forming the pixel electrode above the storage capacitor for each pixel to be electrically connected to the pixel-switching thin film transistor and the pixel-potential electrode.

In the method of manufacturing an electro-optical device according to certain embodiments, it is possible to manufacture the electro-optical device as described above. Specifically, since the dielectric layer constituting the storage capacitor is formed as a passivation layer in the peripheral dielectric layer area, it is possible to enhance the water-resistance and the moisture-resistance of the peripheral circuits and to accomplish simplification of the manufacturing process, thereby enhancing the yield. In the process of forming the storage capacitor, the high-potential electrode, the dielectric layer, and the pixel-potential electrode may be stacked in that order or in the reversed order.

Additional details and exemplary embodiments are disclosed below.

BRIEF DESCRIPTION OF THE DRAWINGS

Various embodiments will be described with reference to the accompanying drawings, wherein like numbers reference like elements.

FIG. 11 is a (first) cross-sectional view sequentially illustrating a process of manufacturing the liquid crystal device according to the first embodiment.

FIG. 12 is a (second) cross-sectional view sequentially illustrating a process of manufacturing the liquid crystal device according to the first embodiment.

FIG. 13 is a (third) cross-sectional view sequentially illustrating a process of manufacturing the liquid crystal device according to the first embodiment.

FIG. 14 is a cross-sectional view illustrating a stacked structure of a peripheral circuit in a process of forming a dielectric layer according to the first embodiment.

DESCRIPTION EXEMPLARY EMBODIMENTS

Hereinafter, exemplary embodiments will be described with reference to the drawings. In the embodiments described below, a TFT active matrix liquid crystal device having a built-in driving circuit is described as an example of an electro-optical device according to certain embodiments.

First Embodiment

A liquid crystal device according to a first embodiment will be described with reference to FIGS. 1 to 10.

Figure 1:
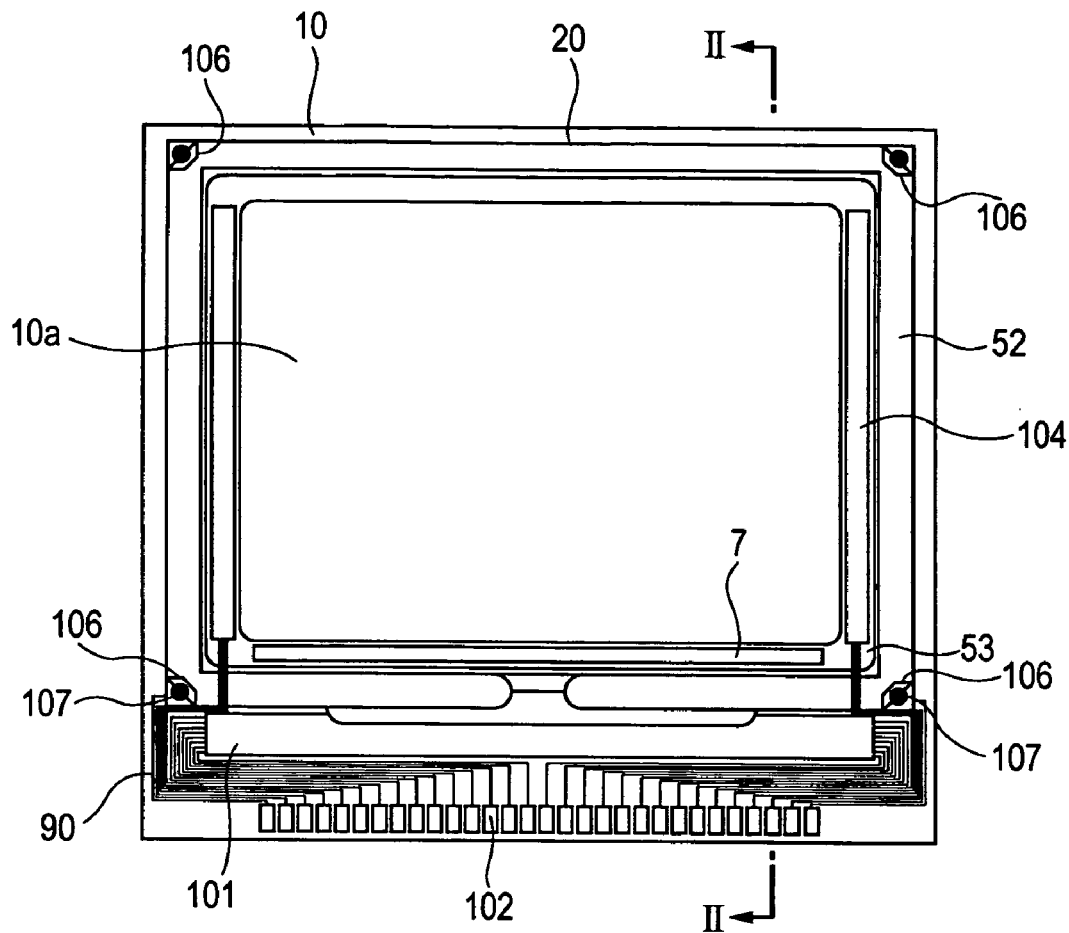
FIG. 1 is a plan view illustrating an entire configuration of a liquid crystal device according to a first embodiment.

First, the entire configuration of the liquid crystal device according to the first embodiment will be described with reference to FIGS. 1 and 2. FIG. 1 is a plan view illustrating the entire configuration of the liquid crystal device according to the first embodiment and FIG. 2 is a cross-sectional view taken along Line H-H'.

Figure 2:
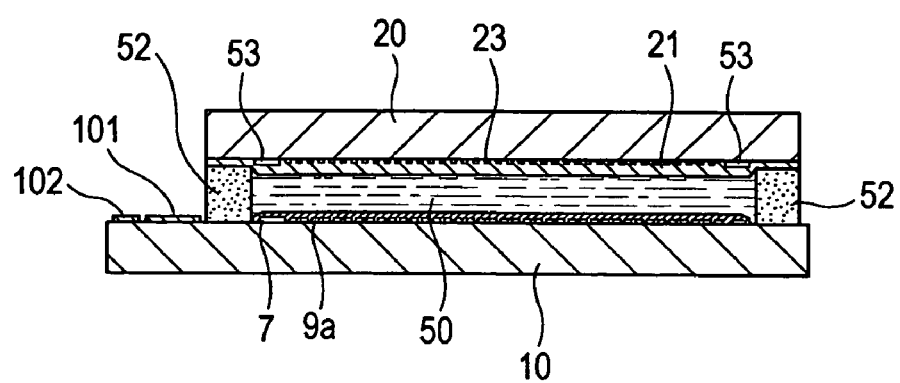
FIG. 2 is a cross-sectional view taken along Line H-H'.

As shown in FIGS. 1 and 2, in the liquid crystal device according to the first embodiment, a TFT array substrate 10 and a counter substrate 20 are opposed to each other. A liquid crystal layer 50 is enclosed between the TFT array substrate 10 and the counter substrate 20. The TFT array substrate 10 and the counter substrate 20 are bonded to each other with a sealing member 52 disposed in a sealing area around an image display area 10a as an example of "a pixel array area" according to certain embodiments.

In FIG. 1, a frame light-blocking layer 53 defining a frame area of the image display area 10a is formed on the counter substrate 20 to be parallel to the inside of the sealing area in which the sealing member 52 is disposed. In an area of the peripheral area outside the sealing area in which the sealing member 52 is disposed, a data-line driving circuit 101 as an example of a "peripheral circuit" according to certain embodiments and external connection terminals 102 are disposed along one side of the TFT array substrate 10. A sampling circuit 7 as an example of the "peripheral circuit" according to certain embodiments is disposed inside the sealing area along the one side to be covered with the frame light-blocking layer 53. A scanning-line driving circuit 104 as an example of the "peripheral circuit" according to certain embodiments is disposed inside the sealing area along two sides adjacent to the one side to be covered with the frame light-blocking layer 53. Vertical electrical connection terminals 106 for electrically connecting both substrates with vertical electrical connection members 107 are provided in areas of the TFT array substrate 10 opposed to four corners of the counter substrate 20. Accordingly, electrical connection between the TFT array substrate 10 and the counter substrate 20 can be accomplished.

Lead wires 90 for electrically connecting the data-line driving circuit 101, the scanning-line driving circuit 104, and the vertical electrical connection terminals 106 to the external connection terminals 102 are formed on the TFT array substrate 10.

In FIG. 2, a stacked structure including the pixel-switching TFT as a driving element and wires such as scanning lines and data lines is formed on the TFT array substrate 10. In the image display area 10a, a pixel electrode 9a is disposed above the pixel-switching TFT and the wires such as the scanning lines and the data lines. On the other hand, a light blocking layer 23 is formed on the surface of the counter substrate 20 opposed to the TFT array substrate 10. A counter electrode 21 made of a transparent material such as ITO is formed on the light blocking layer 23 to be opposed to a plurality of pixel electrode 9a.

On the other hand, in addition to the data-line driving circuit 101 and the scanning-line driving circuit 104, an inspection circuit or an inspection pattern for inspecting quality and defects of the liquid crystal device during manufacturing or at the time of shipping may be formed on the TFT array substrate 10. The inspection circuit is also an example of the "peripheral circuit" according to certain embodiments.

Figure 3:
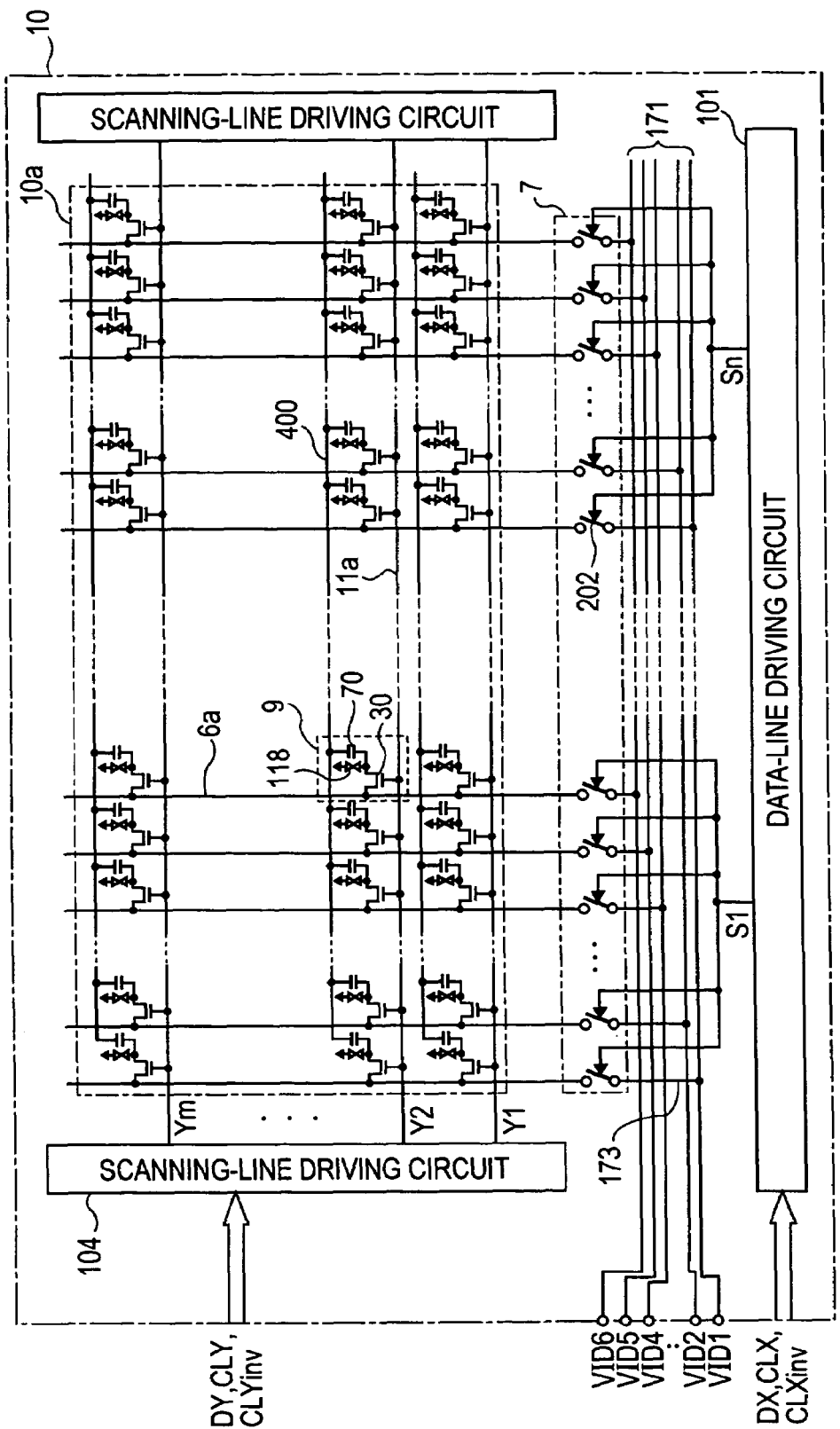
FIG. 3 is a block diagram illustrating an electrical configuration of the liquid crystal device according to the first embodiment.

Next, an electrical configuration of the liquid crystal device will be described with reference to FIG. 3. FIG. 3 is a block diagram illustrating an electrical configuration of the liquid crystal device.

As shown in FIG. 3, the peripheral circuits including the scanning-line driving circuit 104, the data-line driving circuit 101, and the sampling circuit 7 are disposed in the peripheral area around the image display area 10a. In FIG.

3, the lead wires 90 are marked in a stripe shape for the purpose of easy understanding of the electrical connection relation. However, the actual plane layout or wire layout has a complex lead shape (see FIG. 1).

The scanning-line driving circuit 104 is supplied with a Y clock signal CLY, an inverted Y clock signal CLYinv, and a Y start pulse DY. When the Y start pulse DY is input, the scanning-line driving circuit 104 sequentially generates and outputs scanning signals Y1, . . . , Ym at the time corresponding to the Y clock signal CLY and the inverted Y clock signal CLYinv.

The data-line driving circuit 101 is supplied with an X clock signal CLX, an inverted X clock signal CLXinv, and an X start pulse DX. When the X start pulse DX is input, the data-line driving circuit 101 sequentially generates and outputs sampling signals S1, . . . , Sn at the time corresponding to the X clock signal CLX and the inverted X clock signal CLXinv.

The sampling circuit 7 includes a plurality of sampling switches 202 having a single-channel TFT such as P-channel type or N-channel type or a complementary TFT as an example of the "peripheral-circuit thin film transistor" according to certain embodiments.

The liquid crystal device includes the data lines 6a and the scanning lines 11a arranged vertically and horizontally in the image display area 10a occupying the center of the TFT array substrate 10. Pixel electrodes 9a of liquid crystal elements 118 arranged in a matrix shape and pixel-switching TFTs 30 for switching the pixel electrodes 9a are disposed in the respective pixel portions 9 corresponding to intersections between the data lines and the scanning lines. In the first embodiment, it is assumed that the total number of the scanning lines 11a is m (where m is a natural number greater than or equal to 2) and the total number of the data lines 6a is n (where n is a natural number greater than or equal to 2).

In the first embodiment, image signals VID1 to VID6 serial-parallel developed into 6 phases are supplied to the liquid crystal panel 100 through six image signal lines 171. As described below, n data lines 6a are sequentially driven in a unit of data line group, wherein 12 data lines 6a corresponding to the number of the image signal lines 171 form a group.

The sampling signals Si (i=1, 2, . . . , n) are sequentially supplied to the sampling switches 202 corresponding to the data line group from the data-line driving circuit 101 and the respective sampling switches are turned on in response to the sampling signals Si. Each sampling switch 202 is connected to the corresponding image signal line 171 through a branched line 173.

Accordingly, the image signals VID1 to VID6 from the 6 image signal lines 171 are sequentially or simultaneously supplied to the data lines 6a belonging to the data line group through the turned on sampling switch 202. Therefore, the data lines 6a belonging to the data line group are simultaneously driven. As a result, in the first embodiment, since the n data lines 6a are driven in a unit of data line group, it is possible to suppress a driving frequency.

In FIG. 3, paying attention to one pixel portion 9, the source electrode of the pixel-switching TFT 30 is electrically connected to the data line 6a for supplying the image signal VIDk (where k=1, 2, 3, . . . , 6), the gate electrode of the pixel-switching TFT 30 is electrically connected to the scanning line 11a for supplying the scanning signal Yj (where j=1, 2, 3, . . . , m), and the drain electrode of the pixel-switching TFT 30 is connected to the pixel electrode 9a of the liquid crystal element 118. Here, in each pixel portion 9, the liquid crystal element 118 has a configuration that liquid crystal is interposed between the pixel electrode 9a and the counter electrode 21. Accordingly, the pixel portions 6 are arranged in a matrix shape to correspond to the intersections between the scanning lines 11a and the data lines 6a.

The scanning lines 11a are line-sequentially selected by the scanning signals Y1, . . . , Ym output from the scanning-line driving circuit 104. When the scanning signal Yj is supplied to the pixel-switching TFT 30 of the pixel portion 9 corresponding to the selected scanning line 11a, the pixel-switching TFT 30 is turned on and the pixel portion 9 is changed to a selected state. The pixel electrode 9a of the liquid crystal element 118 is supplied with the image signal VIDk from the data line 6a at a predetermined time, by switching off the pixel-switching TFT 30 only for a predetermined time. Accordingly, an application voltage defined by potentials of the pixel electrode 9a and the counter electrode 21 is applied to the liquid crystal element 118. The liquid crystal makes gray scale display possible, by modulating light on the basis of a fact that the alignment or order of molecule set varies depending upon levels of the application voltage. In the normally white mode, the transmissivity of the incident light decreases with the application of voltage in a unit of pixel and in the normally black mode, the transmissivity of the incident light increases with the application of voltage in a unit of pixel. As a whole, light having contrast corresponding to the image signals VID1 to VID6 is emitted from the liquid crystal device.

In order to prevent the leakage of the image signal, a storage capacitor 70 is disposed in parallel with the liquid crystal element 118. One electrode of the storage capacitor 70 is connected to the drain of the pixel-switching TFT 30 in parallel with the pixel electrode 9a and the other electrode is connected to a fixed-potential capacitor wire 400 with a positive potential. For example, since the voltage of the pixel electrode 9a is held by the storage capacitor 70 for the time longer by three digits than the time when the source voltage is applied, the voltage holding characteristic is improved, thereby obtaining a high contrast ratio.

Figure 4:
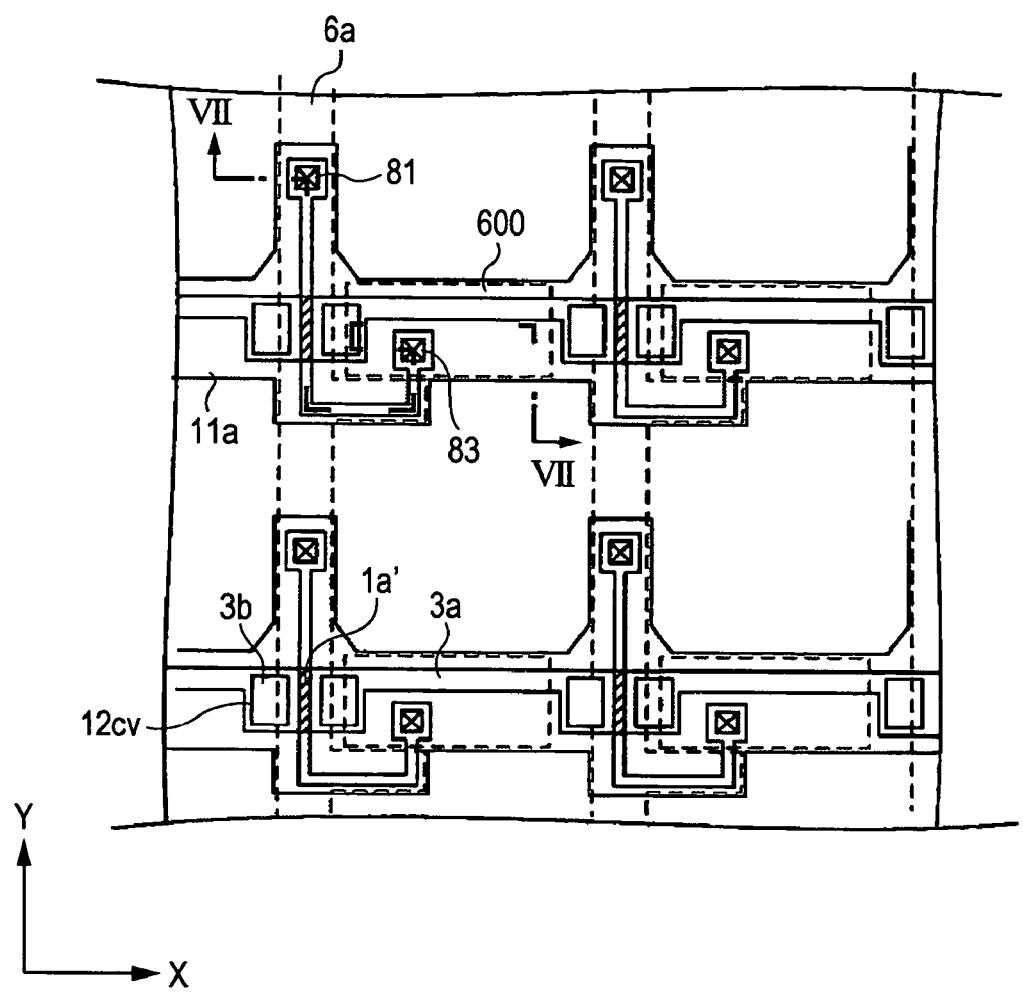
FIG. 4 is a plan view illustrating a group of pixels on a TFT array substrate according to the first embodiment, in which only a configuration relating to a lower layer portion (a portion under reference numeral 6a (data line) in FIG. 7) is shown.
Figure 5:
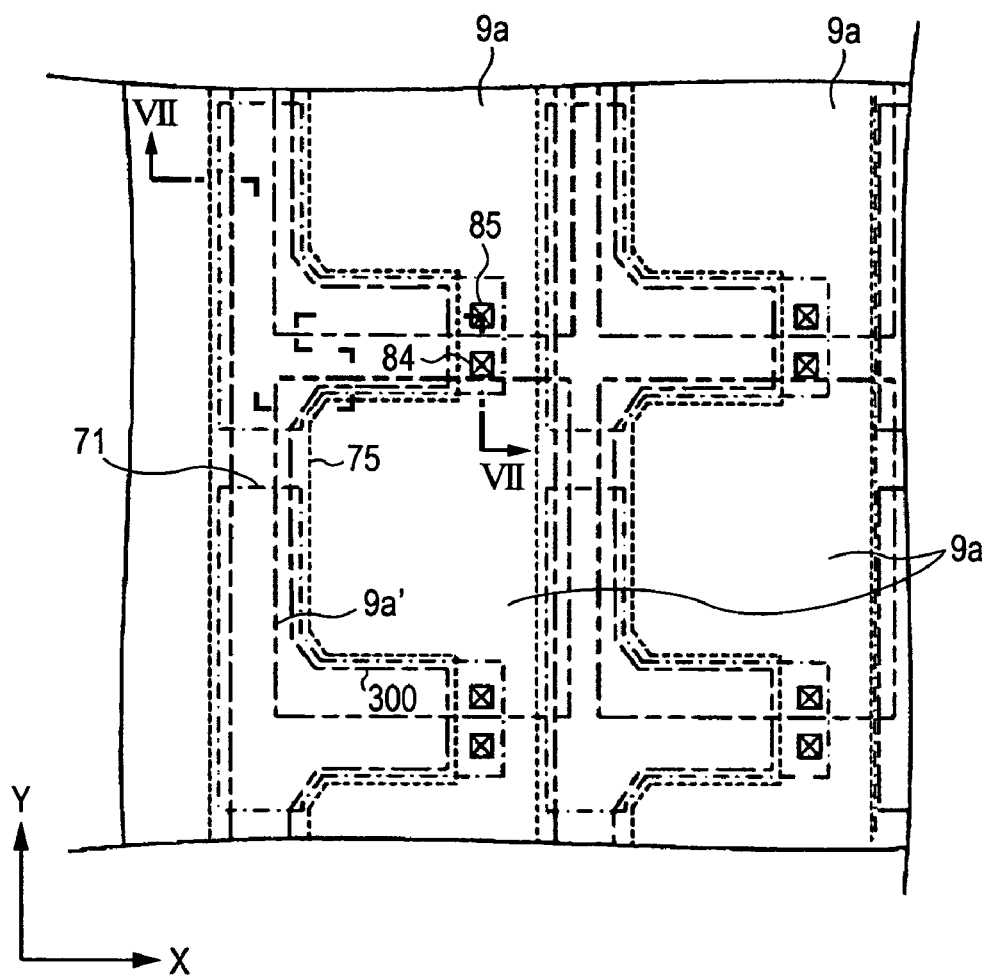
FIG. 5 is a plan view illustrating a group of pixels on the TFT array substrate according to the first embodiment, in which only a configuration relating to an upper layer portion (a portion over reference numeral 6a (data line) in FIG. 7) is shown.
Figure 6:
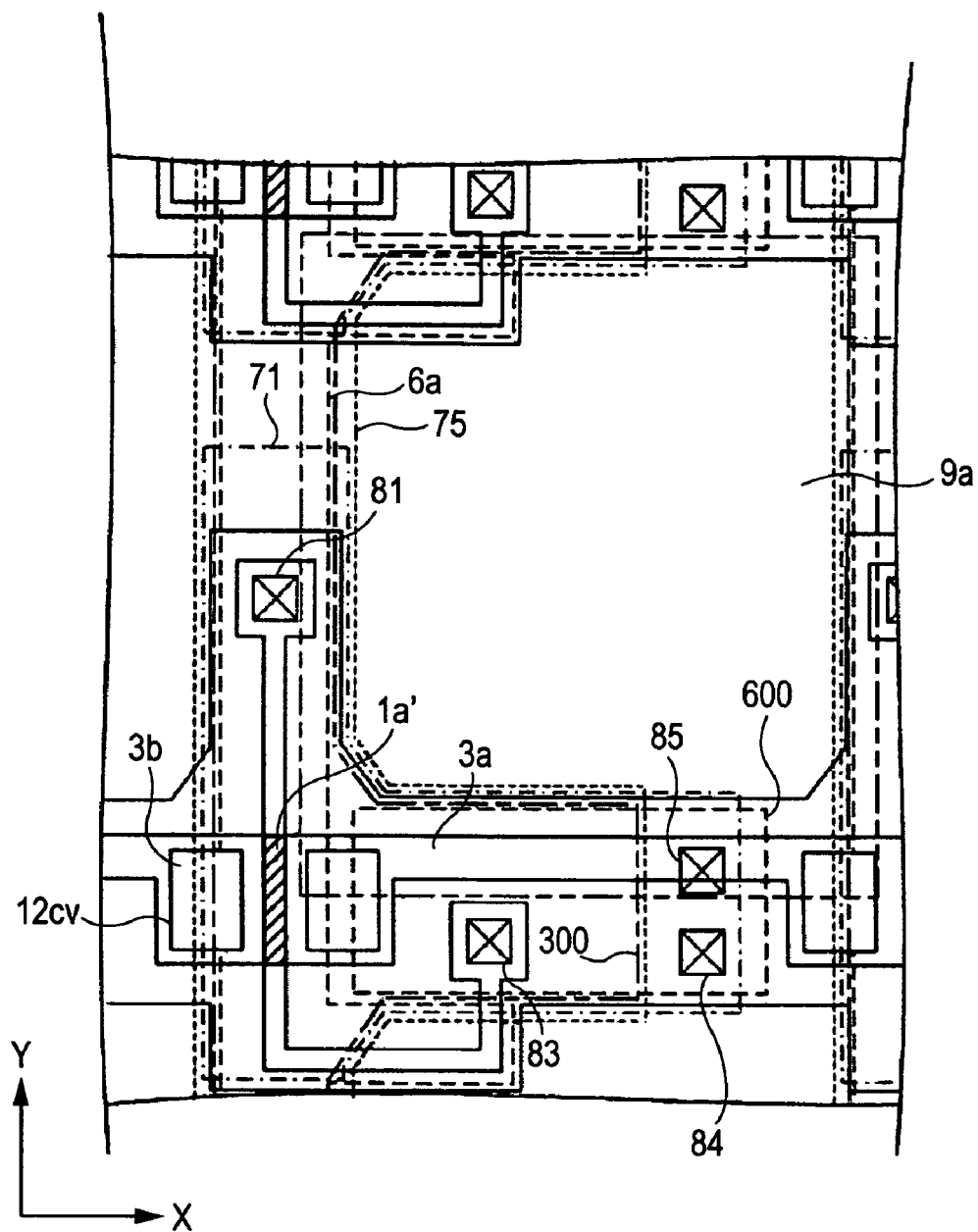
FIG. 6 is a partially enlarged plan view illustrating the state that FIG. 4 and FIG. 5 are superposed.
Figure 7:
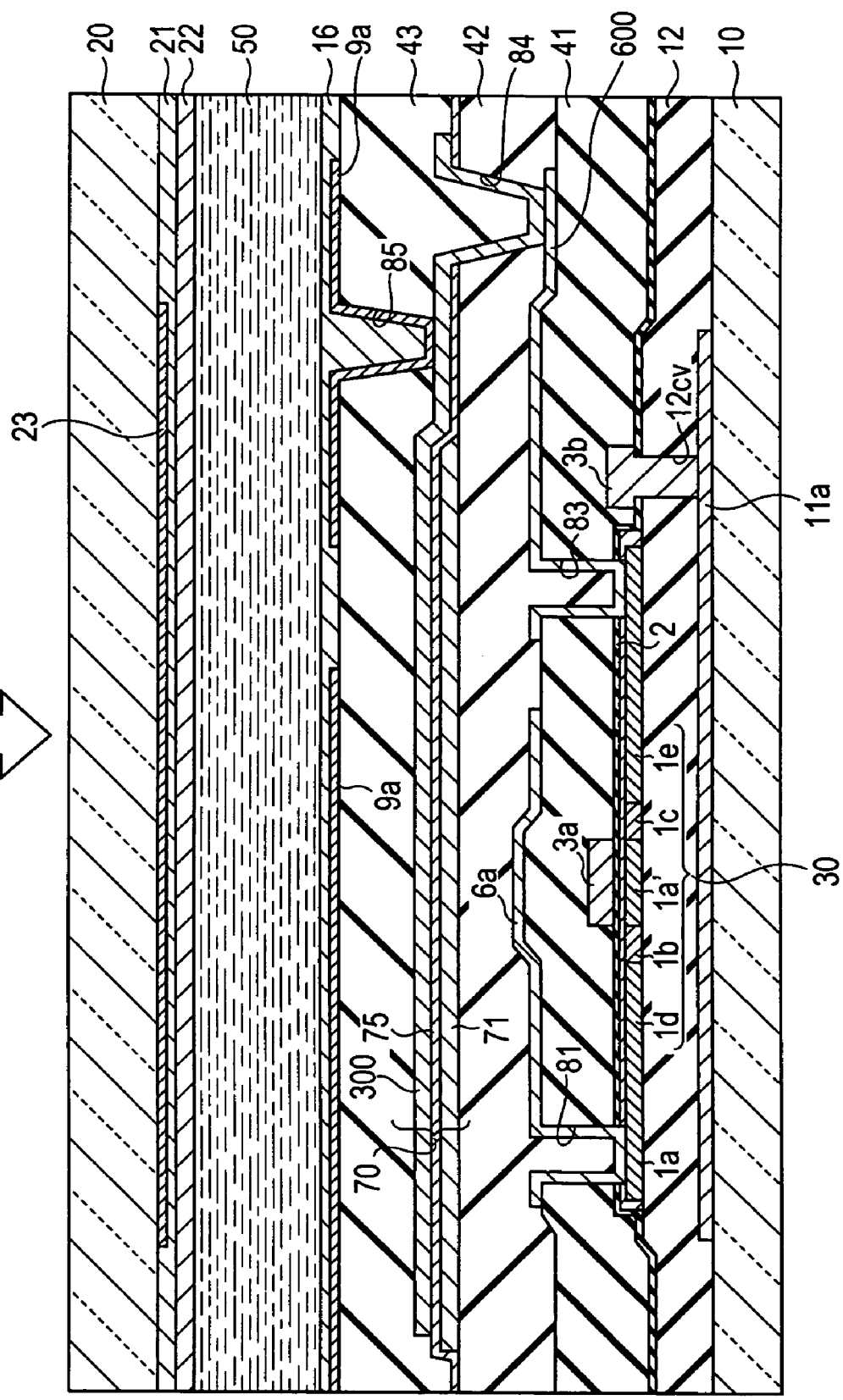
FIG. 7 is a cross-sectional view taken along Line A-A' where the state that FIG. 4 and FIG. 5 are superposed is shown.

Next, a specific configuration of the pixel portion for implementing the above-mentioned operation will be described with reference to FIGS. 4 to 7. FIGS. 4 to 6 are plan views illustrating a partial configuration relating to the pixel portion on the TFT array substrate. FIGS. 4 and 5 correspond to a lower layer portion (FIG. 4) and an upper layer portion (FIG. 5) of a stacked structure to be described later, respectively. FIG. 6 is an enlarged plan view illustrating the stacked structure where FIGS. 4 and 5 are superposed. FIG. 7 is a cross-sectional view taken along Line A-A' where FIGS. 4 and 5 are superposed. In FIG. 7, layers and members are expressed in different scales so as to allow the layers and the members to be visible in the figure.

In FIGS. 4 to 7, the circuit elements of the pixel portions are formed as a patterned and stacked conductive layer on the TFT array substrate 10. The TFT array substrate 10 is formed out of, for example, a glass substrate, a quartz substrate, an SOI substrate, or a semiconductor substrate and is disposed to be opposed to the counter substrate 20 formed out of, for example, a glass substrate or a quartz substrate. The circuit elements are classified into a first layer including the scanning lines 11a, etc., a second layer including the pixel-switching TFTs 30, etc., a third layer including the data lines 6a, etc., a fourth layer including the storage capacitors 70, etc., and a fifth layer including the pixel electrodes 9a, etc. A base insulating layer 12 is disposed between the first layer and the second layer, a first interlayer insulating layer 41 is disposed between the second layer and the third layer, a second interlayer insulating layer 42 is disposed between the third layer and the fourth layer, a third interlayer insulating layer 43 is disposed between the fourth layer and the fifth layer, respectively, so as to prevent the circuit elements from short-circuit. The first to third layers are shown as a lower layer portion in FIG. 4 and the fourth and fifth layers are shown as an upper layer portion in FIG. 5.

Configuration of First Layer—Scanning Line, etc.

The first layer includes the scanning lines 11a. The scanning lines 11a is patterned in a shape having a main line portion extending in the X direction of FIG. 4 and an extension portion extending in the Y direction of FIG. 4. The scanning lines 11a is made of, for example, conductive polysilicon and may be made of single metal including at least one of high melting-point metals such as titanium (Ti), chromium (Cr), tungsten (W), tantalum (Ta), and molybdenum (Mo), alloy thereof, metal silicide, poly silicide, or a stacked body thereof.

Configuration of Second Layer—TFT, etc.

The second layer includes the pixel-switching TFTs 30. The pixel-switching TFTs 30 has, for example, an LDD (Lightly Doped Drain) structure and each pixel-switching TFT includes a gate electrode 3a, a semiconductor layer 1a, and an insulating layer 2 including a gate insulating layer isolating the gate electrode 3a and the semiconductor layer 1a from each other. The gate electrode 3a is made of, for example, conductive polysilicon. The semiconductor layer 1a is made of, for example, polysilicon and includes a channel region 1a', a low-concentration source region 1b, a low-concentration drain region 1c, a high-concentration source region 1d, and a high-concentration drain region 1e. It is preferable that the pixel-switching TFT 30 has the LDD structure, but may have an offset structure that impurities are not implanted into the low-concentration source region 1b and the low-concentration drain region 1c or a self-aligned structure that the high-concentration source region and the high-concentration drain region are formed by implanting impurities with a high concentration using the gate electrode 3a as a mask.

A part 3b of the gate electrode 3a of the pixel-switching TFT 30 is electrically connected to the scanning line 11a through a contact hole 12cv formed in the base insulating layer 12. The base insulating layer 12 is made of, for example, silicon oxide and is formed on the entire surface of the TFT array substrate 10 to have a function of preventing variation in element characteristic of the pixel-switching TFT 30 due to roughness or contamination resulting from polishing the surface of the substrate, in addition to a function of isolating the first layer and the second layer from each other.

The pixel-switching TFT 30 according to the first embodiment is of a top gate type, but may be of a bottom gate type.

Configuration of Third Layer—Data Line, etc.

Third layer includes the data lines 6a and a relay layer 600.

The data lines 6a has, for example, a three-layered structure made of aluminum, titanium, silicon nitride sequentially from the downside. Each data line 6a is electrically connected to the high-concentration source region 1d of the pixel-switching TFT 30 through a contact hole 81 penetrating the first interlayer insulating layer 41.

The relay layer 600 is made of the same layer as the data lines 6a. As shown in FIG. 4, the relay layer 600 and the data lines 6a are separated from each other. The relay layer 600 is electrically connected to the high-concentration drain region 1e of the pixel-switching TFT 30 through a contact hole 83 penetrating the first interlayer insulating layer 41.

The first interlayer insulating layer 41 is made of, for example, NSG (non-silicate glass). Alternatively, the interlayer insulating layer 41 may be made of silicate glass such as PSG (Phosphor Silicate Glass), BSG (Boron Silicate Glass), and BPSG (Boron Phosphor Silicate Glass), silicon nitride, or silicon oxide.

Configuration of Fourth Layer—Storage Capacitor, etc.

The fourth layer includes the storage capacitor 70. In the storage capacitor 70, a capacitor electrode 300 and a lower electrode 71 is opposed to each other with a dielectric layer 75 therebetween. The capacitor electrode 300 is an example of the "pixel-potential electrode" according to certain embodiments and the lower electrode 71 is an example of the "fixed-potential electrode" according to certain embodiments. An extension of the capacitor electrode 300 is electrically connected to the relay layer 600 through a contact hole 84 penetrating the second interlayer insulating layer 42.

The capacitor electrode 300 and the lower electrode 71 are made of, for example, single metal including at least one of high melting-point metals such as titanium (Ti), chromium (Cr), tungsten (W), tantalum (Ta), and molybdenum (Mo), alloy thereof, metal silicide, poly silicide, or a stacked body thereof, and preferably tungsten silicide.

As shown in FIG. 5, in the first embodiment, the dielectric layer 75 is formed in a non-opened area between opened areas of the pixels as seen from the upside of the TFT array substrate 10. That is, the dielectric layer is little formed in the opened areas. Accordingly, even when the dielectric layer 75 is an opaque layer, the transmissivity in the opened area is not deteriorated. Therefore, the dielectric layer 75 is made of silicon nitride having a high dielectric constant without considering the transmissivity. As the dielectric layer, a film having a single layer or a multi-layer of hafnium oxide (HfO2), aluminum oxide (Al2O3), and tantalum (Ta2O5) can be used in addition to the silicon nitride layer. Accordingly, the dielectric layer 75 can also serve as a film for blocking water or moisture, that is, a passivation. That is, since the storage capacitor 70 is formed in the area including a region opposed to the channel region 1a' of the pixel-switching TFT 30 as seen from the upside of the TFT array substrate 10, it is possible to enhance the water-resistance and the moisture-resistance of the pixel-switching TFT 30. As described later, the dielectric layer 75 is also formed in the peripheral dielectric layer area including the regions opposed to the channel regions of the peripheral-circuit TFTs constituting the peripheral circuits such as the data-line driving circuit 101, the scanning-line driving circuit 104, and the sampling circuit 202.

The second interlayer insulating layer 42 is made of, for example, NSG. In addition, silicate glass such as PSG, BSG, and BPSG, silicon nitride, or silicon oxide may be used for the second interlayer insulating layer 42. The surface of the second interlayer insulating layer 42 is subjected to a planarization process such as a chemical mechanical polishing (CMP) process or a polishing process, a spin coating process, and a process of filling concave portions.

Configuration of Fifth Layer—Pixel Electrode, etc.

The third interlayer insulating layer 43 is formed on the entire surface of the fourth layer and the pixel electrodes 9a as the fifth layer are formed thereon. The third interlayer insulating layer 43 is made of, for example, NSG. In addition, silicate glass such as PSG, BSG, and BPSG, silicon nitride, or silicon oxide may be used for the third interlayer insulating layer 43. The surface of the third interlayer insulating layer 43 is subjected to a planarization process such as a CMP process, similarly to the second interlayer insulating layer 42.

The pixel electrode 9a (of which the outline is marked by the dotted line 9a' in FIG. 5) is disposed in the respective pixel areas arranged in longitudinal and lateral directions and the data lines 6a and the scanning lines 11a are arranged at the boundaries thereof in a lattice shape (see FIGS. 4 and 5). The pixel electrodes 9a are formed out of, for example, a transparent conductive layer of ITO (Indium Tin Oxide).

The pixel electrode 9a is electrically connected to the extension of the capacitor electrode 300 through a contact hole 85 penetrating the interlayer insulating layer 43 (see FIG. 7).

As described above, the extension of the capacitor electrode 300 and the relay layer 600 are electrically connected to each other through the contact hole 84 and the relay layer 600 and the high-concentration drain region 1e of the pixel-switching TFT 30 are electrically connected to each other through the contact hole 83. That is, the pixel electrode 9a and the high-concentration drain region 1e of the pixel-switching TFT 30 are connected to each other through the relay layer 600 and the extension of the capacitor electrode 300.

An alignment layer 16 having been subjected to a predetermined alignment process such as a rubbing process is disposed above the pixel electrodes 9a.

Hitherto, the configuration of the pixel portion of the TFT array substrate 10 is described.

On the other hand, the counter electrode 21 is disposed on the entire opposed surface of the counter substrate 20 and an alignment layer 22 is disposed thereon (below the counter electrode 21 in FIG. 7). The counter electrode 21 is formed out of a transparent conductive film of, for example, ITO, similarly to the pixel electrodes 9a. In order to prevent occurrence of light leakage current in the pixel-switching TFT 30, a light blocking layer 23 is disposed between the counter substrate 20 and the counter electrode 21 to cover the region opposed to the pixel-switching TFT 30.

The liquid crystal layer 50 is disposed between the TFT array substrate 10 and the counter substrate 20 having the above-mentioned configurations. The liquid crystal layer 50 is formed by enclosing the liquid crystal in a space formed by sealing the edges of the substrates 10 and 20 with the sealing member. The liquid crystal layer 50 has a predetermined alignment state by the alignment layer 16 and the alignment layer 22 having been subjected to an alignment process such as a rubbing process, when an electric field is not applied between the pixel electrode 9a and the counter electrode 21.

The configuration of the pixel portion described above is true of all the pixel portions, as shown in FIGS. 4 and 5. The pixel portion is periodically formed in the image display area 10a (see FIG. 1). On the other hand, in the liquid crystal device, as described with reference to FIGS. 1 and 2, the peripheral circuits such as the scanning-line driving circuit 104 and the data-line driving circuit 101 are formed in the peripheral area around the image display area 10a with the same stacked structure as the pixel portion.

Figure 8:
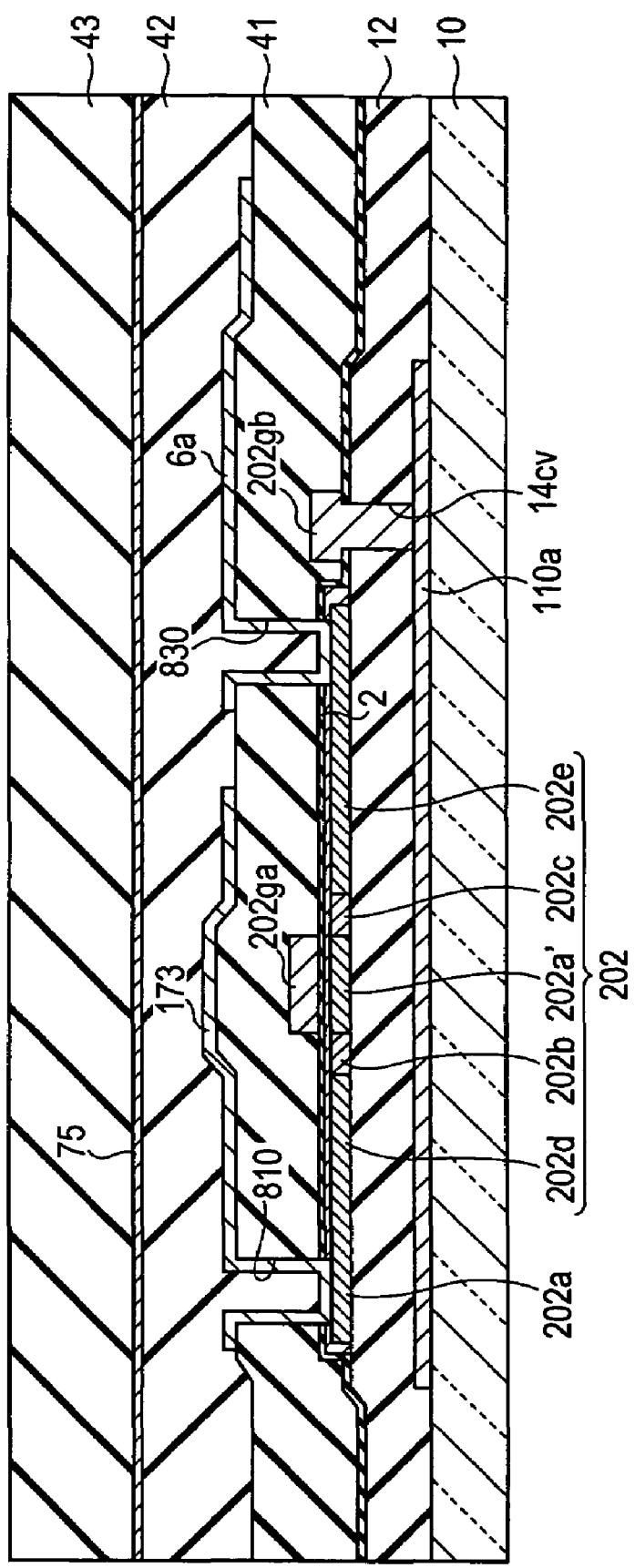
FIG. 8 is a cross-sectional view including a sampling switch of a sampling circuit according to the first embodiment.
Figure 9:
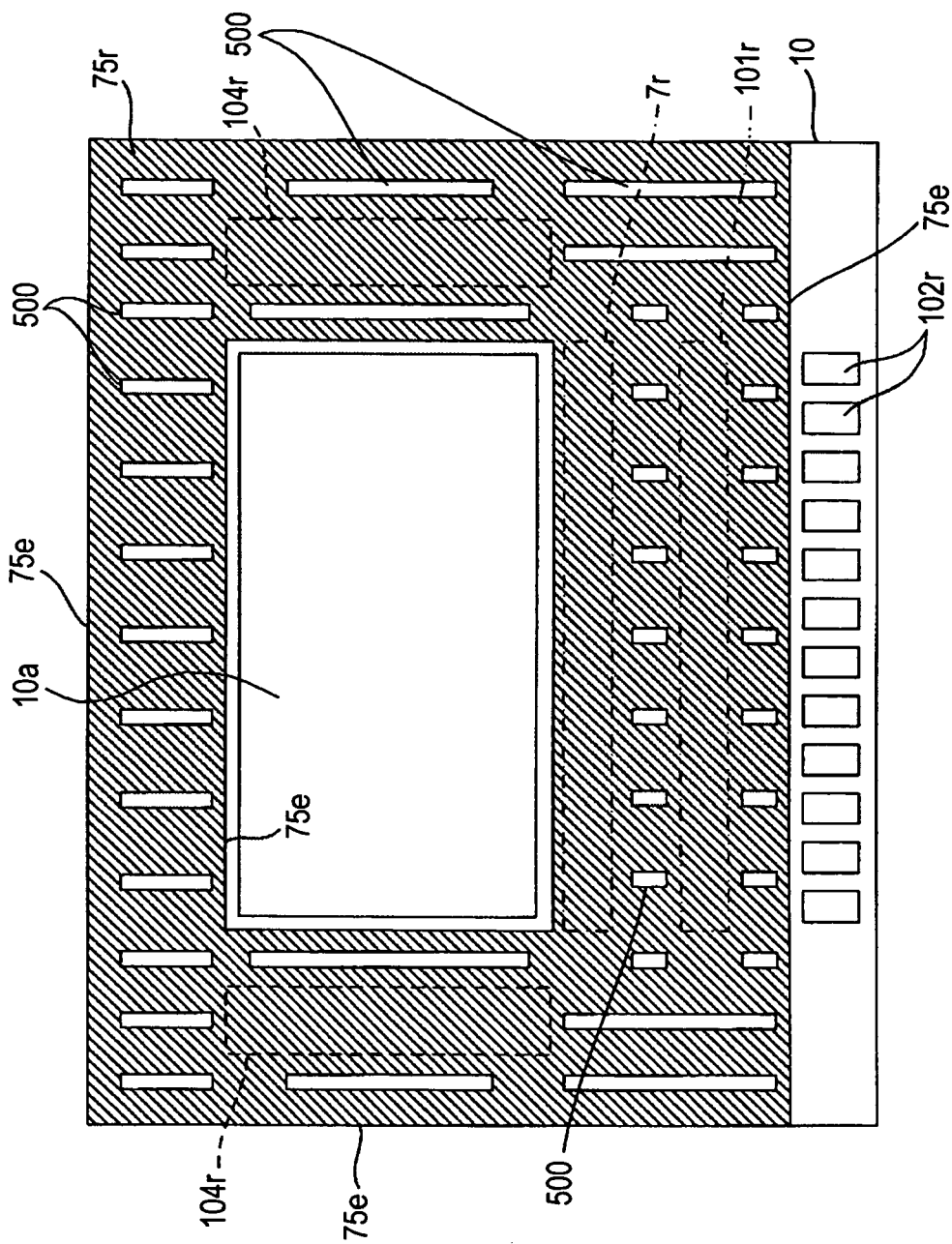
FIG. 9 is a plan view illustrating a dielectric layer in a peripheral dielectric layer area as viewed from the upside of the TFT array substrate according to the first embodiment.
Figure 10:
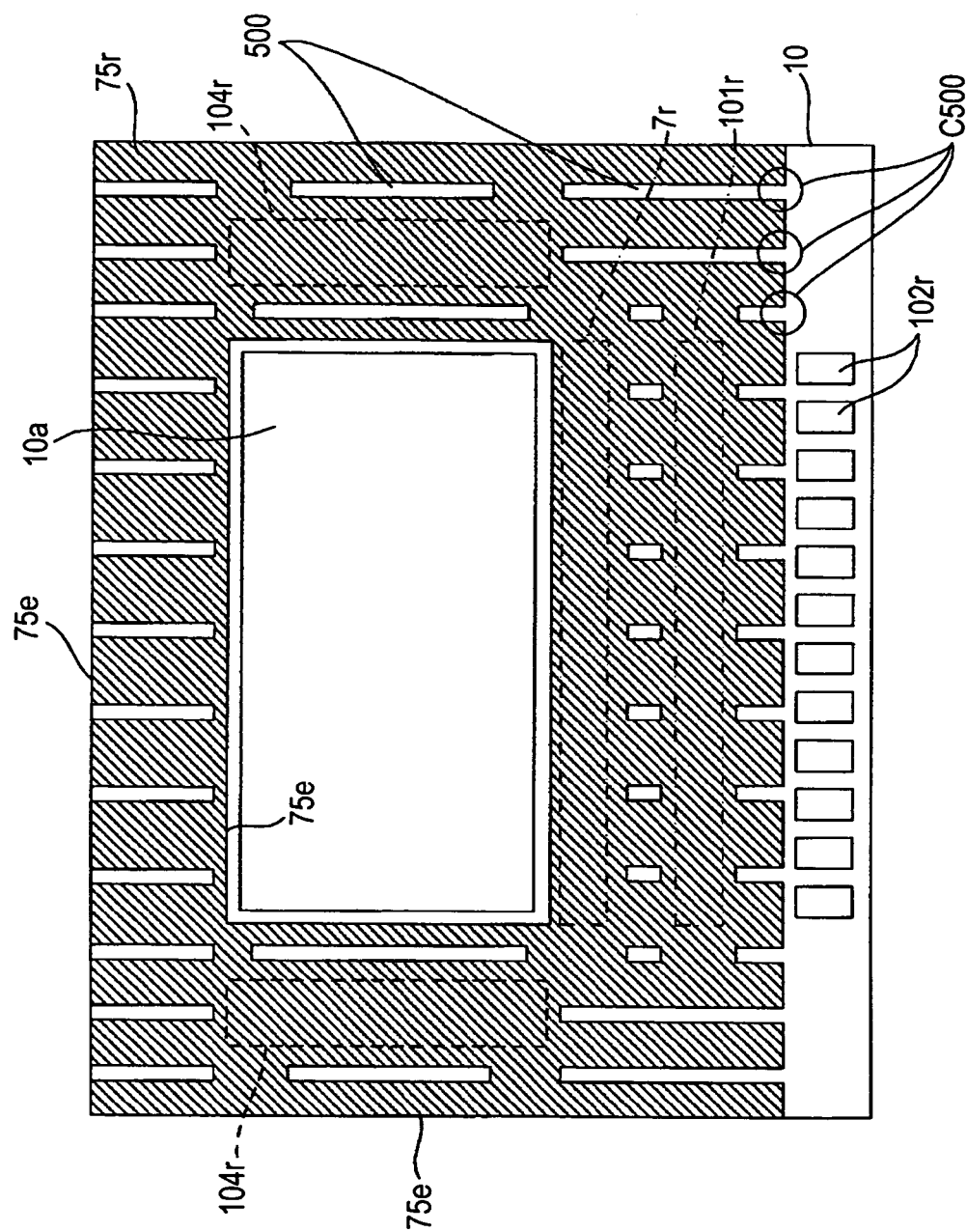
FIG. 10 is a plan view illustrating a dielectric layer in a peripheral dielectric layer area as viewed from the upside of a TFT array substrate according to a modified example.

Next, a specific configuration of the peripheral circuits will be described with reference to FIGS. 8 to 10. Here, a specific configuration of the sampling circuit as an example of the peripheral circuits is concentrically described. FIG. 8 is a cross-sectional view including a sampling switch of the sampling circuit. In FIG. 8, layers and members are expressed in different scales so as to allow the layers and the members to be visible in the figure. FIG. 9 is a plan view illustrating the dielectric layer in the peripheral dielectric layer area as seen from the upside of the TFT array substrate. FIG. 10 is a plan view illustrating the dielectric layer in the peripheral dielectric layer area as seen from the upside of the TFT array substrate according to a modified example.

As shown in FIG. 8, the sampling circuit 7 has the same stacked structure as the pixel portion 9. That is, a light blocking layer 110a positioned in the same layer as the scanning lines 11a is formed as the first layer on the TFT array substrate 10. A sampling switch 202 positioned in the same layer as the pixel-switching TFT 30 is formed as the second layer thereon through the first interlayer insulating layer 41. The sampling switch 202 has the LDD structure similarly to the pixel-switching TFT 30 and includes a gate electrode 202ga, a semiconductor layer 202a, and an insulating layer 2 including a gate insulating layer for isolating the gate electrode 202ga and the semiconductor layer 202a from each other. The gate electrode 202ga is formed in the same layer as the gate electrode 3a of the pixel-switching TFT 30 and the semiconductor layer 202a is formed in the same layer as the semiconductor layer 1a of the pixel-switching TFT 30. The semiconductor layer 202a includes a channel region 202a', a low-concentration source region 202b, a low-concentration drain region 202c, a high-concentration source region 202d, and a high-concentration drain region 202e. It is preferable that the sampling switch 202 has the LDD structure, but may have an offset structure that impurities are not implanted into the low-concentration source region 202b and the low-concentration drain region 202c or a self-aligned structure that the high-concentration source region and the high-concentration drain region are formed by implanting impurities with a high concentration using the gate electrode 202ga as a mask.

A part 202gb of the gate electrode 202ga of the sampling switch 202 is electrically connected to the light blocking layer 110a through a contact hole 14cv formed in the base insulating layer 12. The sampling switch 202 according to the first embodiment is of a top gate type, but may be of a bottom gate type.

The branched line 173 and the data line 6a are formed as the third layer on the sampling switch 202 with the first interlayer insulating layer 41 therebetween. The branched line 173 is electrically connected to the high-concentration source region 202d of the sampling switch 202 through a contact hole 810 penetrating the first interlayer insulating layer 41. The data line 6a is electrically connected to the high-concentration drain region 202e o the sampling switch 202 through a contact hole 830 penetrating the first interlayer insulating layer 41.

In the first embodiment, specifically, as shown in FIGS. 8 and 9, the dielectric layer 75 in the pixel portion 9 is also formed in the peripheral dielectric layer area 75r (the shaded area in FIG. 9) including the region opposed to the channel region 202a' of the sampling switch 202. The peripheral dielectric layer area 75r includes the regions opposed to the channel regions of the peripheral-circuit TFTs constituting the peripheral circuits such as the data-line driving circuit 101 and the scanning-line driving circuit 104. In the first embodiment, the dielectric layer 75 is not formed in the area including regions opposed to external connection terminal regions in which the external connection terminals 102 are positioned, but may be formed therein. Since the dielectric layer 75 can serve as a passivation layer as described above, it is possible to prevent the deterioration of the channel region 202a' of the sampling switch 202 due to water or moisture, thereby enhancing the water-resistance and the moisture-resistance of the sampling switch 202. In order to enhance the performance as the passivation layer, it is preferable that the dielectric layer 75 is formed in an area as wide as possible in the peripheral area, more preferably in the entire area thereof. Specifically, when the sampling switch 202 is of a P-channel type, the channel region 202a' can be easily deteriorated due to water or moisture. Accordingly, it is possible to more effectively prevent the deterioration of the channel region 202a' of the sampling switch 202 due to the moisture or water by the use of the dielectric layer 75.

In the first embodiment, specifically, as described above, since the dielectric layer 75 serves as the capacitor layer of the storage capacitor 70 and the passivation layer, it is not necessary to stack a new layer as the passivation layer. Accordingly, it is possible to enhance the water-resistance and the moisture-resistance of the peripheral circuits without causing the complication of the configuration of the peripheral circuits such as the sampling circuit 202, the data-line driving circuit 101, and the scanning-line driving circuit 104.

As a result, it is possible to simplify the stacked structure on the TFT array substrate 10 and to enhance the water-resistance and the moisture-resistance of the pixel-switching TFT 30 and the peripheral-circuit TFT such as the sampling switch 202 by the use of the dielectric layer 75.

In the first embodiment, specifically, as shown in FIG. 9, slits 500 are formed in the dielectric layer 75 in the peripheral dielectric layer 75r (the shaded area in FIG. 9). That is, in the dielectric layer 75, the slits 500 are formed between the edge 75e of the peripheral dielectric layer area 75r and a scanning-line driving circuit area 104r in which the scanning-line driving circuit 104 is disposed, between the edge 75e of the peripheral dielectric layer area 75r and a data-line driving circuit area 101r in which the data-line driving circuit 101 is disposed, between a sampling circuit area 7r in which the sampling circuit 202 is disposed and the data-line driving circuit area 101r, between the scanning-line driving circuit area 104r and the image display area 10a, between the data-line driving circuit area 101r and the image display area 10a, and between the sampling circuit area 7r and the image display area 10a, as seen from the upside of the TFT array substrate 10. Accordingly, it is possible to reduce stress resulting from the fact that the dielectric layer 75 is interposed between the upper and lower layers. The stress can be remarkably generated through a heating process in the process of manufacturing an electro-optical device, but the stress can be efficiently reduced thanks to the slits. In addition, it is also possible to reduce the stress generated after completing a product or at the time of operation. Accordingly, it is possible to prevent damages such as cracks due to the stress in the dielectric layer 75. As a result, it is possible to enhance the reliability of the electro-optical device.

As shown as a modified example in FIG. 10, the slits 500 may be formed to be cut in from the edge 75e of the peripheral dielectric layer area 75r (see circle C500 in FIG. 10).

In this case, it is possible to enhance the water-resistance and moisture-resistance of the peripheral circuits such as the scanning-line driving circuit 104, the data-line driving circuit 101, and the sampling circuit 202 and to more efficiently prevent damages such as cracks due to the stress in the dielectric layer 75.

Manufacturing Method

Next, a method of manufacturing the electro-optical device will be described with reference to FIGS. 8 and 9 and FIGS. 11 to 16. FIGS. 11 to 13 and FIGS. 15 and 16 are cross-sectional views sequentially illustrating the stacked structure of the electro-optical device in process steps of the manufacturing process as sections corresponding to FIG. 7. FIG. 14 is a cross-sectional view illustrating the stacked structure of the peripheral circuit in the process step of forming the dielectric layer as a section corresponding to FIG. 8. Here, the process steps of forming the scanning line, the TFT, the data line, the storage capacitor, the pixel electrode, and the sampling circuit as an example of the peripheral circuit, which are important parts of the liquid crystal device according to the first embodiment, are concentrically described.

First, in the process step shown in FIG. 11, the layers from the scanning line 11a to the first interlayer insulating layer 41 are formed and stacked in the image display area 10a (see FIG. 9) on the TFT array substrate 10. At this time, the pixel switching TFT 30 is formed in the region corresponding to the intersection between the scanning line 11a and the data line 6a to be formed later.

At the same time, as shown in FIG. 8, the layers from the light block layer 110a in the same layer as the scanning line 11a to the first interlayer insulating layer 41 are formed and stacked in the sampling circuit area 7r (see FIG. 9) on the TFT array substrate 10.

A general semiconductor integration technology can be used for the respective process steps. After forming the first interlayer insulating layer 41, the surface thereof may be planarized by a CMP process or the like.

Next, in the process step shown in FIG. 12, the contact hole 81 having such a depth to reach the high-concentration source region 1d and the contact hole 83 having such a depth to reach the high-concentration drain region 1e are formed in the image display area 10a by performing an etching process to predetermined positions of the surface on the first interlayer insulating layer 41.

In the same process step, as shown in FIG. 8, the contact hole 810 having such a depth to reach the high-concentration source region 202d and the contact hole 830 having such a depth to reach the high-concentration drain region 202e are formed in the sampling circuit area 7r by performing an etching process to predetermined positions of the surface on the first interlayer insulating layer 41.

Next, in the image display area 10a, the conductive light blocking layer is stacked in a predetermined pattern and the data line 6a and the relay layer 600 are formed. The data line 6a is connected to the high-concentration source region 1d through the contact hole 81. The relay layer 600 is connected to the high-concentration drain region 1e through the contact hole 83.

In the same process step, as shown in FIG. 8, the branched line 173 and the data line 6a are formed in the sampling circuit area 7r. The branched line 173 is connected to the high-concentration source region 202d through the contact hole 810. The data line 6a is connected to the high-concentration drain region 202e through the contact hole 830.

Next, a precursor layer 42a of the second interlayer insulating layer 42 is formed on the entire surface of the TFT array substrate 10, that is, in the area including all of the image display area 10a and the peripheral area including the sampling circuit area 7r. Unevenness is formed on the surface of the precursor layer 42a due to the pixel-switching TFT 30, the data line 6a, and the contact holes 81 and 83. Accordingly, the second interlayer insulating layer 42 is obtained by forming the precursor layer 42a with a large thickness and then polishing the precursor layer up to the position indicated by a dotted line in the figure by the use of the CMP process to planarize the surface thereof.

Next, in the process step shown in FIG. 13, the lower electrode 71 is formed in the image display area 10a by stacking the conductive light blocking layer in a predetermined area, including the region opposed to the channel region 1a', on the surface of the second interlayer insulating layer 42. Next, the dielectric layer 75 is formed in a predetermined pattern in the non-opened area on the TFT array substrate 10. At this time, the predetermined pattern includes the region opposed to the channel region 1a'.

In the same process step, as shown in FIG. 14, the dielectric layer with a predetermined pattern is formed in the area, including the region opposed to the channel region 202a', in the sampling circuit area 7r. At this time, as shown in FIG. 9, the dielectric layer 75 is similarly formed in the other peripheral area. That is, the dielectric layer 75 with a predetermined pattern is formed in the area, including the region opposed to the channel region of the TFT constituting the data-line driving circuit 101 and the scanning-line driving circuit 104, in the data-line driving circuit area 101r and the scanning-line driving circuit area 104r. Next, as shown in FIG. 9, the slits are formed by performing an etching process to predetermined positions on the surface of the dielectric layer 75. In this way, by forming the slits 500, it is possible to reduce the stress resulting from the fact that the dielectric layer 75 is interposed between the upper and lower layers. The stress can be remarkably generated through a heating process in the process of manufacturing the electro-optical device, but the stress can be efficiently reduced thanks to the slits. Accordingly, it is possible to prevent damages such as cracks due to the stress in the dielectric layer 75.

Figure 15:
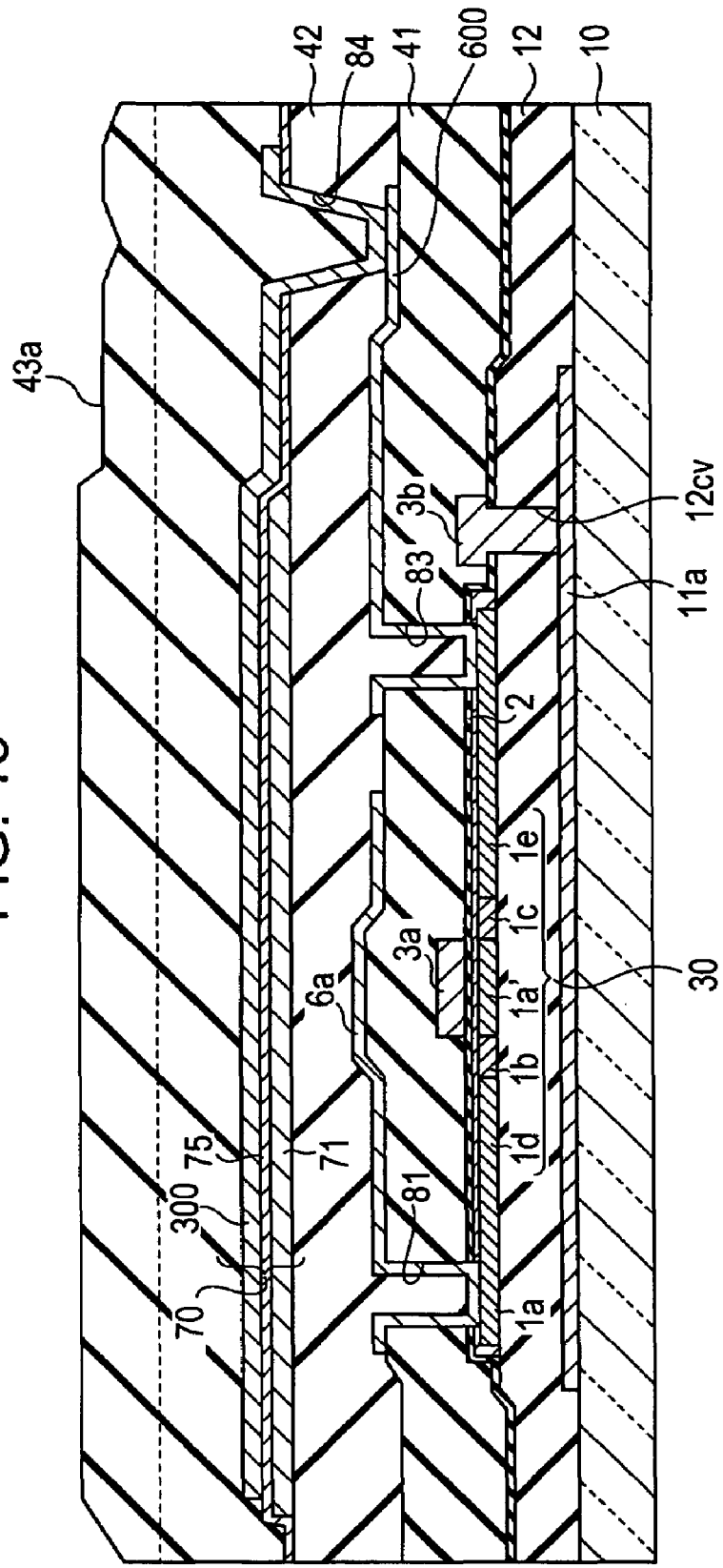
FIG. 15 is a (fourth) cross-sectional view sequentially illustrating a process of manufacturing the liquid crystal device according to the first embodiment.

Next, in the process step shown in FIG. 15, the contact hole 84 having such a depth to reach the relay layer 600 is formed in the image display area 10a by etching predetermined positions on the surface of the dielectric layer 75. Next, the capacitor electrode 300 is formed by stacking the conductive light block layer in a predetermined area including the region opposed to the channel region 1a'.

Next, a precursor layer 43a of the third interlayer insulating layer 43 is formed on the entire surface of the TFT array substrate 10, that is, in the area including the image display area 10a and the peripheral area including the sampling circuit area 7r. Unevenness is formed on the surface of the precursor layer 43a due to the storage capacitor 70 and the contact hole 84. Accordingly, the second interlayer insulating layer 42 is obtained by forming the precursor layer 43a with a large thickness and then polishing the precursor layer up to the position indicated by a dotted line in the figure by the use of the CMP process to planarize the surface thereof (see FIG. 8 with respect to the peripheral area).

Figure 16:
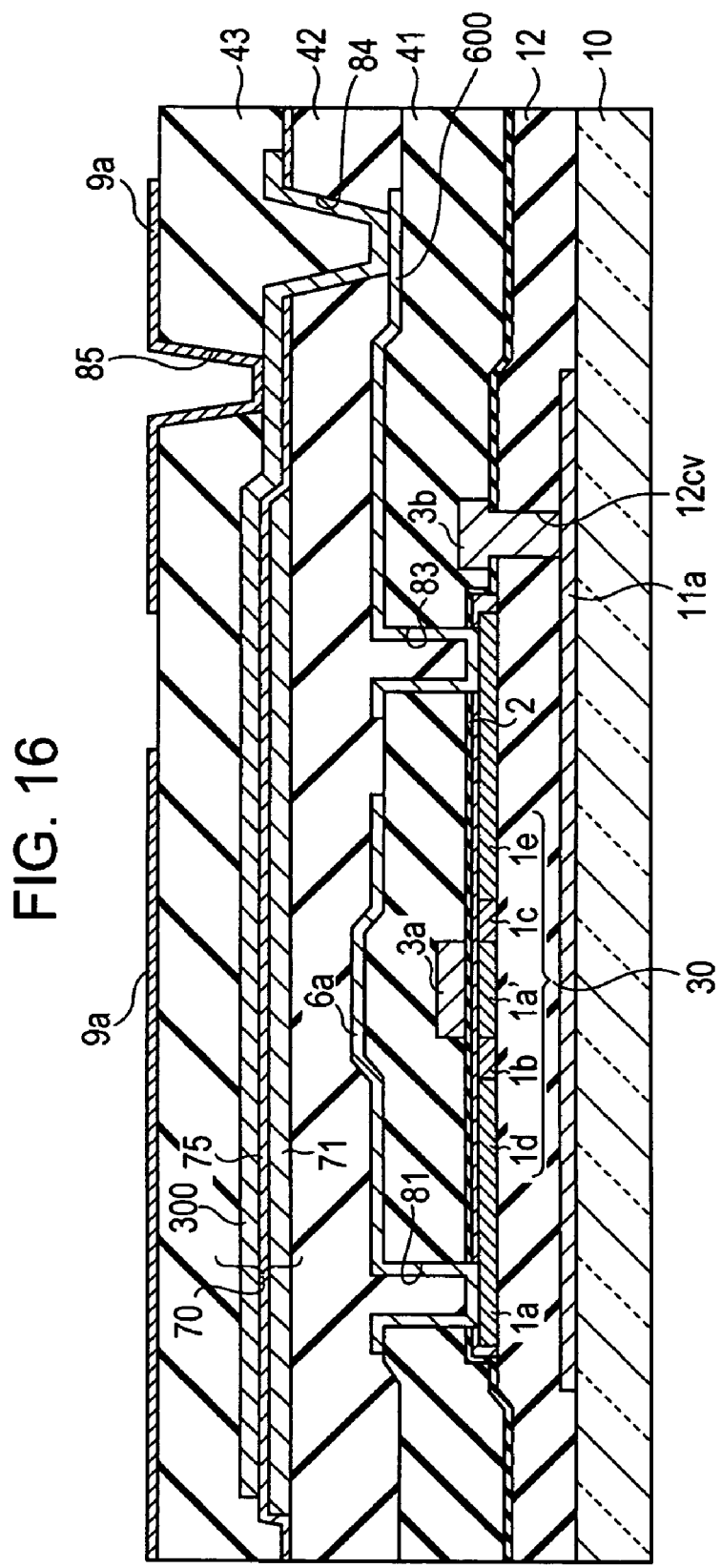
FIG. 16 is a (fifth) cross-sectional view sequentially illustrating a process of manufacturing the liquid crystal device according to the first embodiment.

Next, in the process step shown in FIG. 16, the contact hole 85 having such a depth to reach the extension of the capacitor electrode 300 is formed in the image display area 10a by performing an etching process to a predetermined position on the surface of the third interlayer insulating layer 43. Next, the pixel electrode 9a is formed at a predetermined position on the surface of the third interlayer insulating layer 43. At this time, the pixel electrode 9a is formed inside the contact hole 85, but the step coverage is good because the hole diameter of the contact hole 85 is large.

According to the above-mentioned method of manufacturing a liquid crystal device, it is possible to manufacture the liquid crystal device according to the first embodiment described above. Specifically, since the dielectric layer 75 constituting the storage capacitor 300 is formed as a passivation layer in the peripheral dielectric layer area 75r including the sampling circuit area 7r, the data-line driving circuit area 101r, and the scanning-line driving circuit area 104, it is possible to enhance the water-resistance and moisture-resistance of the peripheral circuit such as the sampling circuit 202, the data-line driving circuit 101, and the scanning-line driving circuit 104 and to accomplish the simplification of the manufacturing process, thereby enhancing the yield.

Electronic Apparatus

Next, a variety of electronic apparatuses employing the liquid crystal device which is an electro-optical device will be described.

Figure 17:
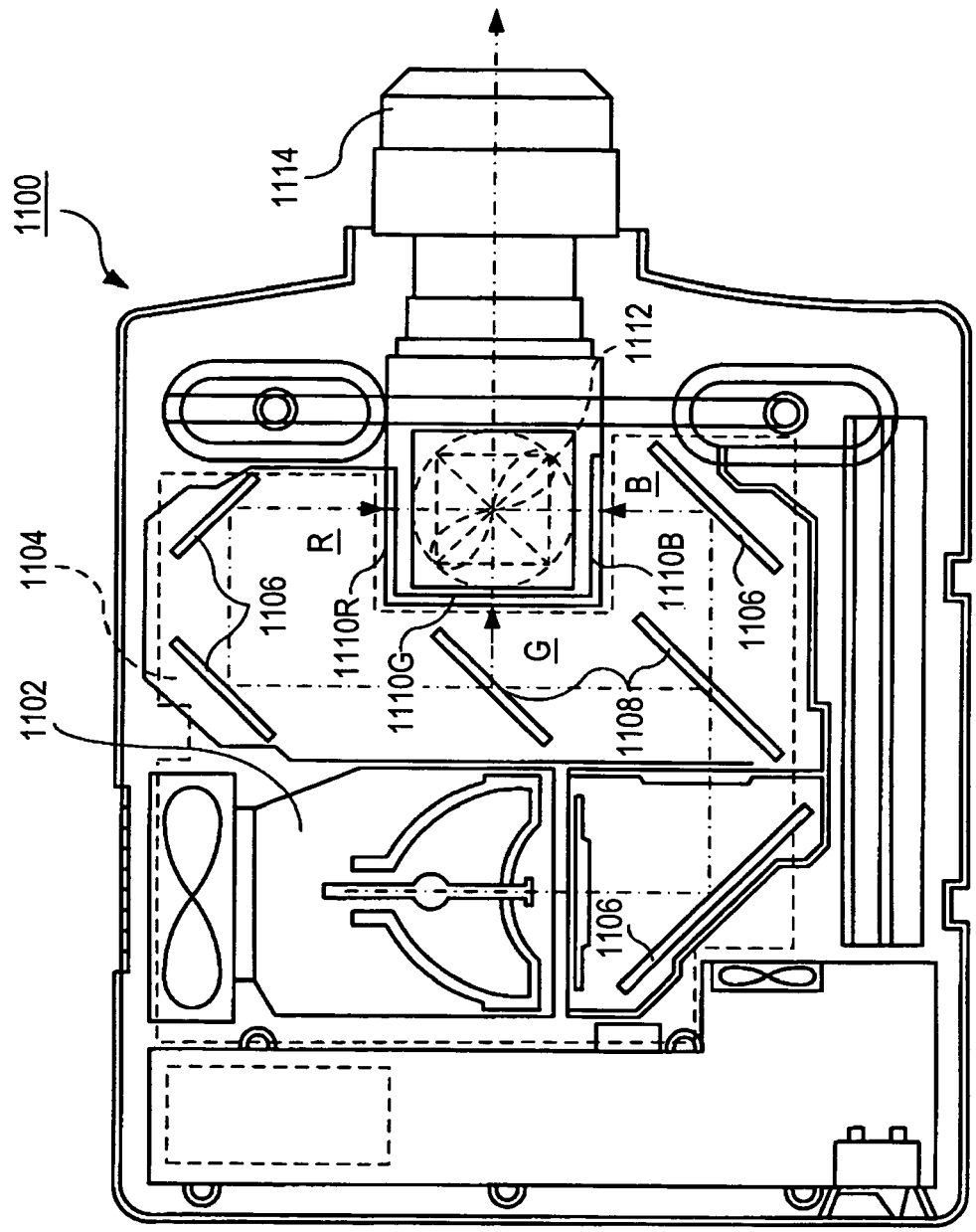
FIG. 17 is a plan view illustrating a configuration of a projector as an example of an electronic apparatus employing an electro-optical device.

First, a projector employing the liquid crystal device as a light valve will be described. FIG. 17 is a plan view illustrating an exemplary configuration of a projector. As shown in FIG. 17, a lamp unit 1102 including a white light source such as a halogen lamp is disposed in the projector 1100. Projection light emitted from the lamp unit 1102 is divided into light components corresponding to three primary colors of R, G, and B by four sheets of mirrors 1106 and two sheets of dichroic mirrors 1108 and the light components are guided to liquid crystal panels 1110R, 1110G, and 1110B as light valves corresponding to the primary colors.

The liquid crystal panels 110R, 110G, and 110B have a configuration equal to that of the liquid crystal device and are driven in response to primary color signals supplied from an image signal processing circuit. The light components modulated by the liquid crystal panels are incident on a dichroic prism 1112 from three sides. In the dichroic prism 1112, the light components of R and B are refracted by 90 degrees and the light component of G goes straightly. Accordingly, the light components are synthesized and thus a color image is projected to a screen through a projection lens 1114.

Here, paying attention to display images from the liquid crystal panels 1110R, 1110G, and 1110B, the display image from the liquid crystal panel 1110G are laterally inverted with respect to the display images from the liquid crystal panels 1110R and 1110B.

Since the light components corresponding to the primary colors of R, G, and B are incident on the liquid crystal panels 1110R, 1110G, and 1110B through the dichroic mirrors 1108, it is not necessary to dispose color filters.

Figure 18:
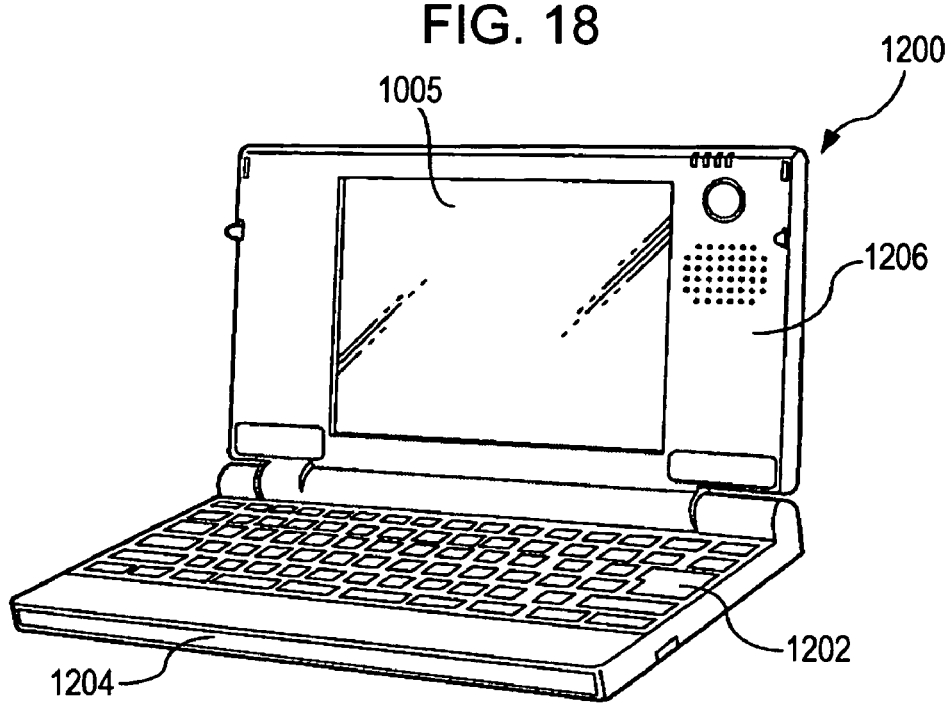
FIG. 18 is a perspective view illustrating a configuration of a personal computer as an example of the electronic apparatus employing an electro-optical device.

A mobile personal computer employing the liquid crystal device is described. FIG. 18 is a perspective view illustrating a configuration of the mobile personal computer. As shown in FIG. 18, the personal computer 1200 includes a main body unit 1204 having a keyboard 1202 and a liquid crystal display unit 1206. In the liquid crystal display unit 1206, a backlight is disposed in the back side of the liquid crystal device 1005 described above.

Figure 19:
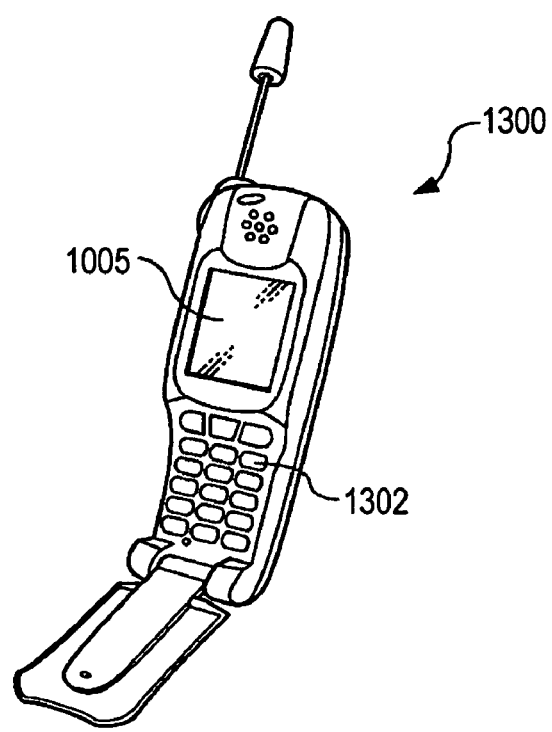
FIG. 19 is a perspective view illustrating a configuration of a mobile phone as an example of the electronic apparatus employing an electro-optical device.

A mobile phone employing the liquid crystal device is described. FIG. 19 is a perspective view illustrating a configuration of the mobile phone. The mobile phone 1300 includes a plurality of manipulation buttons 1302 and a reflective liquid crystal device 1005. In the reflective liquid crystal device 1005, a front light is disposed in the front side thereof as needed.

In addition to the electronic apparatuses described with reference to FIGS. 17 to 19, examples of the electronic apparatus can include a liquid crystal television, a view finder type or monitor direct vision-type video tape recorder, a car navigation apparatus, a pager, an electronic pocketbook, an electronic calculator, a word processor, a work station, a television phone, a POS terminal, an apparatus having a touch panel, and the like. The above-mentioned electro-optical device can apply to the electronic apparatuses.

In addition to the liquid crystal device described in the above-mentioned embodiments, certain embodiments can apply to a reflective liquid crystal display device (LCOS), a plasma display panel (PDP), a field emission display (FED, SED), an organic EL display, and the like in which elements are formed on a silicon substrate.

It should be understood that the preceding is merely a description of several embodiments. The invention is not limited to the above-mentioned embodiments, but can be properly modified in various forms without departing from the gist and spirit of the invention which can be understood from the appended claims and the whole specification. Therefore, it can be understood by those skilled in the art that an electro-optical device including such modifications, an electronic apparatus employing the electro-optical device, and a method of manufacturing the electro-optical device do not depart from the spirit and scope of the principles disclosed. Thus, to the maximum extent allowed by law, the scope of the invention is to be determined by the broadest permissible interpretation of the following claims and their equivalents, and shall not be restricted or limited by the foregoing description.

What is claimed is:

1. An electro-optical device including a pixel array area in which are arranged a plurality of pixels, the electro-optical device comprising:
    a data line and a scanning line extending to intersect each other on a substrate;
    a pixel-switching thin film transistor disposed in the pixel that corresponds to an intersection of the data line and the scanning line, the pixel-switching thin film transistor being disposed below the data line on the substrate;
    a storage capacitor, in plan view, being disposed above the data line and having a stacked structure of a fixed-potential electrode, a dielectric layer, and a pixel-potential electrode, the fixed-potential electrode and the pixel-potential electrode being separate layers that sandwich the dielectric layer, and the storage capacitor being disposed in an area including a region opposed to a channel region of the pixel-switching thin film transistor;
    a pixel electrode electrically connected to the pixel-potential electrode and the pixel-switching thin film transistor, the pixel electrode being disposed above the storage capacitor;
    a peripheral circuit for driving the pixel electrode through the data line and the scanning line, the peripheral circuit being disposed in a peripheral area located around the pixel array area, the peripheral circuit including a peripheral-circuit thin film transistor having a channel region; and
    the dielectric layer including a peripheral dielectric layer area having, in plan view, a region opposed to the channel region of the peripheral-circuit thin film transistor.

2. The electro-optical device according to claim 1, wherein the dielectric layer includes a slit in the peripheral dielectric layer area.

3. The electro-optical device according to claim 2, wherein the peripheral dielectric layer has an edge and a peripheral circuit area and a plurality of slits, and at least some of the slits are formed between the edge of the peripheral dielectric layer area and the peripheral circuit area and between the pixel array area and the peripheral circuit area as seen in plan view.

4. The electro-optical device according to claim 2, further including a plurality of slits and wherein at least some of the slits extend to, and are cut-in from, the edge of the peripheral dielectric layer area.

5. An electronic apparatus comprising the electro-optical device according to claim 1.

6. A method of manufacturing an electro-optical device having a pixel array area in which are arranged a plurality of pixels, the method comprising:
    forming a pixel-switching thin film transistor for each pixel, each pixel-switching thin film transistor having a channel region;
    forming a peripheral-circuit thin film transistor in a peripheral circuit, each peripheral-circuit thin film transistor having a channel region;
    forming data lines above the pixel-switching thin film transistor;
    forming a storage capacitor above the data lines in an area including a region opposed to the channel region of the pixel-switching thin film transistor in plan view, the storage capacitor having a stacked structure of a fixed-potential electrode, a dielectric layer, and a pixel-potential electrode, and the dielectric layer being formed in a non-opened area between opened areas of the pixels and an area including a region opposed to the channel region of the peripheral-circuit thin film transistor; and
    forming a pixel electrode above the storage capacitor for electrically connecting each pixel to the pixel-switching thin film transistor and the pixel-potential electrode.

7. The electro-optical device according to claim 1, wherein the dielectric layer includes a non-opened area located between opened areas of the pixels.

8. The electro-optical device according to claim 1, wherein the dielectric layer is disposed in an area as wide as reasonably possible in the peripheral area located around the pixel array area.

9. An electro-optical device comprising:
    data lines and scanning lines extending to intersect each other on a substrate;
    a pixel-switching thin film transistor disposed in pixels that correspond to an intersection of the data lines and the scanning lines, the pixel-switching thin film transistor being disposed below the data lines on the substrate;
    a storage capacitor having a stacked structure of a fixed-potential electrode, a dielectric layer, and a pixel-potential electrode, and the storage capacitor, in plan view, being disposed in an area including a region opposed to a channel region of the pixel-switching thin film transistor and being disposed above the data lines;
    a pixel electrode electrically connected to the pixel-potential electrode and the pixel-switching thin film transistor, the pixel electrode being disposed above the storage capacitor for each pixel;
    a peripheral circuit for driving the pixel electrode through the data lines and the scanning lines, the peripheral circuit being disposed in a peripheral area located around a pixel array area in which the pixels are arranged and including a peripheral-circuit thin film transistor having a channel region that is disposed below the storage capacitor; and wherein, in plan view, the dielectric layer includes
a non-opened area located between opened areas of the pixels and
a peripheral dielectric layer area having slits and a region opposed to the channel region of the peripheral-circuit thin film transistor.

10. The electro-optical device according to claim 9, wherein the slits are formed between edges of the peripheral dielectric layer area and a peripheral circuit area in which the peripheral circuit is disposed, and between edges of the pixel array area and the peripheral circuit area, as seen in plan view.

11. The electro-optical device according to claim 9, wherein the slits extend to, and are cut-in, from edges of the peripheral dielectric layer area.

12. The electro-optical device according to claim 9, wherein the dielectric layer is disposed in an area as wide as reasonably possible in the peripheral area located around the pixel array area.

* * * * *